(12) United States Patent
Gu et al.

(10) Patent No.: US 7,394,412 B2
(45) Date of Patent: Jul. 1, 2008

(54) UNIFIED INTERLEAVER/DE-INTERLEAVER

(75) Inventors: Zhenguo Gu, Plano, TX (US);
Jean-Pierre Giacalone, Vence (FR);
Alexandra Raphaele Bireau, Biot (FR)

(73) Assignee: Texas Instruments Incorporated, Dallas, TX (US)

( * ) Notice: Subject to any disclaimer, the term of this patent is extended or adjusted under 35 U.S.C. 154(b) by 851 days.

(21) Appl. No.: 10/758,663

(22) Filed: Jan. 15, 2004

(65) Prior Publication Data

US 2005/0157685 A1     Jul. 21, 2005

(51) Int. Cl.
*H03M 7/00* (2006.01)
*G06F 12/00* (2006.01)
(52) U.S. Cl. .................. 341/81; 711/157; 714/702
(58) Field of Classification Search .......... 341/81; 711/157; 714/702
See application file for complete search history.

(56) References Cited

U.S. PATENT DOCUMENTS

| 7,024,596 B2* | 4/2006 | Xin ............................ 714/702 |
| 2002/0087923 A1* | 7/2002 | Eroz et al. .................. 714/702 |
| 2004/0240409 A1* | 12/2004 | Mantha et al. .............. 370/328 |

* cited by examiner

*Primary Examiner*—Howard Williams
(74) *Attorney, Agent, or Firm*—Ronald O. Neerings; Wade J. Brady, III; Frederick J. Telecky, Jr.

(57) ABSTRACT

An interleaver/de-interleaver that may be used for multiple interleaving algorithms and look up tables (LUTs) of one or more interleaving standards. In at least some embodiments, the interleaver/de-interleaver may comprise an initial value selector, offset selector, and a pruning adjuster coupled to a combining block. The interleaver/de-interleaver may further comprise a boundary regulator coupled to the combining block, wherein the boundary regulator is configurable to modify an output of the combining block according to one or more pre-determined rules. The interleaver/de-interleaver may further comprise a controller coupled to, at least, the initial value selector, the offset value selector, and the offset adjuster, whereby the interleaver/de-interleaver may be used to interleave or de-interleave a block of data in accordance with a plurality of interleaving algorithms.

28 Claims, 37 Drawing Sheets

| (1) 3.1.3 (TABLE 1 IN [1]) OF GSM 05.03 V8.5.0 RELEASE 1999 $\quad$ K=0:455; $\quad$ B=MOD(K,8); $\quad$ J=2*MOD(49*K,57)+FLOOR(MOD(K,8)/4); (DEPTH 8) $\quad$ } 301 |||
|---|---|---|
| PARAMETERS | INTERLEAVER VALUES | DE-INTERLEAVER VALUES |
| INITIAL VECTOR ("VI") | (0, 98, 82, 66) | (0, 228), (57, 285), (114, 342), (171, 399) |
| VI CONTROL ("VI_SEL") | K[B1B0]. (RPT(0,1,2,3)) | J[B0]. (RPT(0,1)) |
| DELTA VECTOR ("VD") | (49, 51) | ( 64 ) |
| ACS INITIAL VALUE ("ACS_VI") | 0 | 0 |
| ACS UPDATE RATE | ¼ | 1/2 |
| ADJUST VALUE ("SUBTRACT_V") | 114 | 456 |
| SELECT LINE 1 FOR VD MULTIPLEXER ("B0") | K[B2]. (RPT(00001111)) | 0 |
| SELECT LINE 2 FOR VD MULTIPLEXER ("B1") | 0 | 0 |
| SELECT LINE FOR MULTIPLEXER 108 ("B2") | 0 | 0 |
| N_ADDR_PTR | 8 (ASSEMBLE ONE CDBK FROM 8 BURSTS) | 2 (ASSEMBLE ONE BURST FROM TWO CDBK'S) |
| BURST/CODE BLOCK ("CDBK") INDEX CALCULATION | K[B2B1B0] (MOD(K,8)) | N - MOD(J,2) + FLOOR(BST_IDX/4) FOR BST_IDX=0,1,...,7. |
|  |  | NOTES: FOR BURST 0~3, EVEN INDEX J IS FOR CDBK N, AND ODD INDEX IS FOR CDBK N-1. FOR BURST 4~7, EVEN INDEX IS FOR CDBK N+1, ODD INDEX IS FOR CDBK N. ASSEMBLY CODE NEED BE CAREFUL ON THE ADDR. POINTER POSITION IN HWA. |

Figure 3

CODE FOR 3.1.3 (TABLE 1 IN [1]) OF GSM 05.03 V8.5.0 RELEASE 1999

LOAD TABLE 1.
TB1;

%INTERLEAVING DESCRIBED IN THE STANDARD
K=0:455;
B=MOD(K,8);
J=2*MOD(49*K,57)+FLOOR(MOD(K,8)/4);
} 401

% HWA IMPLEMENTATION

VI=[0 98 82 66];
VI_SEL=MOD(K,4);
VD=[49 51];
ACS=ZEROS(4,114);
FOR KK=2:114
  ACS(:,KK)=MOD(ACS(:,KK-1)+VD(REM((KK-1),2)+1),114);
END
J1=MOD(ACS(:)'+VI(VI_SEL+1),114);
} 403

%DEINTERLEAVER FOR INTERLEAVING

J=0:113;

% HWA IMPLEMENTATION

VI_SEL=REM(J,2);
VD=64;
ACS=MOD(VD*FLOOR(J/2),456)
} 405

CONTINUED FROM 4A...

CODE FOR 3.1.3 (TABLE 1 IN [1]) OF GSM 05.03 V8.5.0 RELEASE 1999

% HWA IMPLEMENTATION
VI=[0 228];
J1=MOD(ACS+VI(VI_SEL+1),456);
} COLUMN 0 AND 4 OF TABLE 1 OF GSM STANDARD

VI=[57 285];
J1=MOD(ACS+VI(VI_SEL+1),456);
} COLUMN 1 AND 5 OF TABLE 1 OF GSM STANDARD

VI=[114 342];
J1=MOD(ACS+VI(VI_SEL+1),456);
} COLUMN 2 AND 6 OF TABLE 1 OF GSM STANDARD

VI=[171 399];
J1=MOD(ACS+VI(VI_SEL+1),456);
} COLUMN 3 AND 7 OF TABLE 1 OF GSM STANDARD

Figure 4B

| \(2\) 3.2.3 (TABLE 4 IN [1]) OF GSM 05.03 V8.5.0 RELEASE 1999 ||||
|---|---|---|---|
| NO CLOSED FORM EXPRESSIONS PROVIDED BY THE STANDARD.<br>K=0:227;    (DEPTH 4) ||||

| PARAMETERS | INTERLEAVER VALUES | DE-INTERLEAVER VALUES |
|---|---|---|
| VI | (0,13,8,9,4,5,12,1,16,2,17,10,11,15, 6,7,3,14,18)×6  (SEE NOTE 1) | (0,18,8,28,4,22,12,34,16,36,14,32, 10, 30,6,24,2,26,20) |
| VI_SEL | MOD(FLOOR(K/2),19)<br>RPT(0,0,1,1,2,2,...,17,17,18,18) | MOD(FLOOR(J/12),19)<br>(0R12,1R12, ...,7R12, 8R12,9R6) FOR BST 0 AND 2;<br>MOD(FLOOR((J+6)/12),19) FOR BST 1 AND 3. THE FLOOR ACCUMULATOR MUST BE INITIALIZED WITH 9.<br>(9R6,10R12,11R12,...,18R12) |
| VD | ( 2 ) | ( 38 ) |
| ACS_INITV | 0 | 0 FOR BURST 0 AND 2; 114 FOR BURST 1 AND 3. |
| ACS UPDATE RATE | 1/38 | ½ |
| SUBTRACT_V | 0 (NOT USED.  SET 0 TO SAVE POWER) | 228 |
| B0 | 0 | 0 |
| B1 | 0 | 0 |
| B2 | 0 | 0 |
| N_ADDR_PTR | 4 (ASSEMBLE 1 CDBK FROM 4 BURSTS) | 2 (ASSEMBLE ONE BURST FROM 2 CDBK'S) |
| BURST/CDBK_IDX CALCULATION | B=VI[B1]+2*LSB(K)+FLOOR(J0/11 4)<br>(REFER FIG.4 FOR VI AND J0) | BURST INDEX 0&2 OR 1&3 ARE MAPPED FROM CDBK INDEX N AND N-1 RESPECTIVELY. |
| NOTES | 1. THE INPUT VECTOR IS 19X7 BITS<br>2. THE CARRY_IN OF THE OUTPUT ADDER IS CONNECTED TO LSB OF K. | |

Figure 5A

| (3) 3.3.4 (DEPTH 19) OF GSM 05.03 V8.5.0 RELEASE 1999 | | |
|---|---|---|
| K = 0,1,...,455<br>N = 0,1,...,N,N + 1,...<br>B = B0 +4N + (K MOD 19) + (K DIV 114)<br>J = (K MOD 19) + 19 (K MOD 6) | | |
| PARAMETERS | INTERLEAVER VALUES | DE-INTERLEAVER VALUES |
| VI | (0,19,38,57,76,95) | (0,114,228,342) |
| VI_SEL | MOD(FLOOR(K/19),6) | MOD(-MOD(J,19)+X,4), X IS 2 LSB OF THE CURRENT BURST INDEX, RANGED FROM 0~21. |
| VD, ACS_INPUT | 20 | (96, 1) |
| ACS_INITV | 0 | 0 |
| ACS UPDATE RATE | 1 | 1 |
| SUBTRACT_V | 114 | 114 |
| B0 | 0 | RPT( 0R18, 1 ) |
| B1 | 0 | 0 |
| B2 | 0 | 0 |
| N_ADDR_PTR | 22 (ASSEMBLE ONE CDBK FROM 22 BURSTS) | 6 (ASSEMBLE ONE BURST FROM 6 CDBK'S) |
| BURST_IDX/CDBK_I DX CALCULATION | (K MOD 19) + (K DIV 114) A DEDICATED CIRCUIT (2 ACCUMULATORS). | 2 LSB OF (MOD(J,19)+Y), Y=3,2,1 OR 0 DEPENDING ON CURRENT BURST INDEX. |
| NOTES: | SUBTRACT_V = 0 FOR ADS TO SAVE POWER.<br><br>ACS NEED BE RESET WHENEVER MOD(K,19)=0. | CURRENT_BST_IDX RANGES FROM 0 TO 21. N IS THE CURRENT CDBK INDEX. THE DE-INTERLEAVER IS GIVEN J=0,1,...,113 AND CURRENT_BST_IDX AS INPUT, AND OUTPUTS THE K_IDX AND CDBK_IDX. THE CDBK_IDX IS INTERNALLY USED AS THE ADDR POINTER SELECTION AND K_IDX IS USED TO FETCH THE INPUT DATA. |

Figure 5B

(4) 3.9.3.2 (TABLE 1 IN [1]) TCH/AFS ONSET OF GSM 05.03 V8.5.0 RELEASE 1999

$K = 4,5,6,7, 12,13,14,15,20,21,22,23 \ldots,455$
$N = 0,1,\ldots,N,N+1,\ldots$
$B = B0 + 4N + (K \bmod 8) - 4$
$J = 2((49K) \bmod 57) + ((K \bmod 8) \operatorname{DIV} 4)$

| PARAMETERS | INTERLEAVER VALUES | DE-INTERLEAVER VALUES |
|---|---|---|
| VI | (51, 35, 19, 3) | (0, 228), (57, 285), (114, 342), (171, 399) |
| VI_SEL | MOD(K,4) (RPT(0,1,2,3)) | MOD(J,2) (RPT(0,1)) |
| VD | (100) | ( 64 ) |
| ACS_INITV | 100 | 0 |
| ACS UPDATE RATE | ¼ | 1/2 |
| SUBTRACT_V | 114 | 456 |
| B0 | 0 | 0 |
| B1 | 0 | 0 |
| B2 | 0 | 0 |
| N_ADDR_PTR | 4 (ASSEMBLE ONE CDBK FROM 4 BURSTS) | 2 (ASSEMBLE ONE BURST FROM TWO CDBK'S) |
| NOTES | BIT DE-REORDERING/DTX REMOVING IS AUTOMATICALLY DONE. | SAME AS 3.1.3 (FIGURE 3). THE 1ST CDBK IS FROM SPEECH CHANNEL, AND THE 2ND CDBK IS FROM ONSET CHANNEL. |

Figure 5C (5) 3.10.1.4 (TABLE 4 IN [1]) TCH/AFS SID_UPDATE OF GSM 05.03 V8.5.0 RELEASE 1999

TOTAL 456 BITS.
I(B,J) = C(N,K)
K = 0,1,...,227
N = 0,1,...,N,N+1,...
B = B0 + 2N + B

I(B,J) = C(N,K+228)
K = 0,1,...,227
N = 0,1,...,N,N+1,...
B = B0 + 2N + ((B + 2) MOD 4)

| PARAMETERS | INTERLEAVER VALUES | DE-INTERLEAVER VALUES |
|---|---|---|
| NOTES: | RUN 3.2.3 (FIGURE 5A) TWICE ON 1ST AND 2ND 228 BITS RESPECTIVELY. SWITCH ADDRESS POINTERS ACCORDINGLY IN 2ND RUN. | |

Figure 5D

| (6) 3.10.2 (TABLE 4 IN [1]) TCH/AHS SID_UPDATE_INH OF GSM 05.03 V8.5.0 RELEASE 1999 ||| 
|---|---|---|
| THE 228 CODED BITS<br>FOR K = 1,3,5,7,...,227<br>      N = 0,1,...,N,N+1,...<br>      B = B0 + 2N + B - 2 ||| 
| PARAMETERS | INTERLEAVER VALUES | DE-INTERLEAVER VALUES |
| VI | (0,13,8,9,4,5,12,1,16,2,17,10,11, 15,6,7,3,14,18)×6 (SEE NOTE 1) | |
| VI_SEL | MOD(K,19)<br>(RPT(0,1,2,...,17,18)) | |
| VD | (2) | |
| ACS_INITV | 0 | |
| ACS UPDATE RATE | 1/19 | |
| SUBTRACT_V | 0 (NOT USED. SET 0 TO SAVE POWER) | |
| B0 | 0 | |
| B1 | 0 | |
| B2 | 0 | |
| N_ADDR_PTR | 2 (ASSEMBLE 1 CDBK FROM 2 BURSTS) | |
| BURST INDEX CALCULATION | B=VI[B1]+2+FLOOR(J0/114) (REFER FIG.4 FOR VI AND J0) | |
| NOTES | 1. THE CARRY_IN OF THE OUTPUT ADDER IS CONNECTED TO "1".<br>2. THE LSB OF THE OUTPUT J INDEX IS THROWN AWAY. | SAME AS 3.2.3 (FIGURE 5A) EXCEPT USING ADDR. POINTERS OF SID_UPDATE_INH CHANNEL FOR ODD J INDEX AND SPEECH CHANNEL FOR EVEN INDEX. |

Figure 5E

| (7) 3.10.4.2 (TABLE 4 IN [1]) SID_FIRST_P2 OF GSM 05.03 V8.5.0 RELEASE 1999 |||
|---|---|---|
| THE CODED 228 BITS: $I(B,J) = C(N,K)$ FOR $K = 0,2,4,6,...,226$ $N = 0,1,...,N,N+1,...$ $B = B0 + 2N + B$ |||
| PARAMETERS | INTERLEAVER VALUES | DE-INTERLEAVER VALUES |
| VI | (0,13,8,9,4,5,12,1,16,2,17,10,11,15, 6,7,3,14,18)×6  (SEE NOTE 1) | |
| VI_SEL | MOD(K,19)  (RPT(0,1,2,...,17,18)) | |
| VD | ( 2 ) | |
| ACS_INITV | 0 | |
| ACS UPDATE RATE | 1/19 | |
| SUBTRACT_V | 0 (NOT USED. SET 0 TO SAVE POWER) | |
| B0 | 0 | |
| B1 | 0 | |
| B2 | 0 | |
| N_ADDR_PTR | 2 (ASSEMBLE 1 CDBK FROM 2 BURSTS) | |
| BURST INDEX CALCULATION | B=VI[B1]+FLOOR(J0/114) (REFER FIG.4 FOR VI AND J0) | |
| NOTES | 1. WHETHER ×6 IS PUT INSIDE THE VECTOR OR OUTSIDE IS TBD, DEPENDING ON THE AVAILABLE INTERFACE BITS.<br>2. THE CARRY_IN OF THE OUTPUT ADDER IS CONNECTED TO "0".<br>3. THE LSB OF THE OUTPUT J INDEX IS THROWN AWAY. | SAME AS 3.2.3 (FIGURE 5A) EXCEPT USING ADDR. POINTERS OF SID_FIRST_P2 CHANNEL FOR EVEN J INDEX AND SID_FIRST_P1 CHANNEL FOR ODD J INDEX. |

Figure 5F

(8) 3.11.4 E_TCH/F28.8 OF GSM 05.03 V8.5.0 RELEASE 1999

K = 0,1,...,1367
N = 0,1,...,N,N+1,...
B = B0 + 4N + (K MOD 19) + (K DIV 342)
J = (K MOD 19) + 19(K MOD 18)

| PARAMETERS | INTERLEAVER VALUES | DE-INTERLEAVER VALUES |
|---|---|---|
| VI | (0,1,2,3,4,5,6,7,8,9,10,11,12,13,14,15,16,17)X19 | (0,342,684,1026) |
| VI_SEL | MOD(FLOOR(K/19),18) | MOD(-MOD(J,19)+X,4), X IS 2 LSB OF THE CURRENT BURST INDEX, RANGED FROM 0~21. |
| VD, ACS_INPUT | (20) | (324, 1) |
| ACS_INITV | 0 | 0 |
| ACS UPDATE RATE | 1 | 1 |
| SUBTRACT_V | 342 | 342 |
| B0 | 0 | RPT( 0R18, 1 ) |
| B1 | 0 | 0 |
| B2 | 0 | 0 |
| N_ADDR_PTR | 22 (ASSEMBLE ONE CDBK FROM 22 BURSTS) | 6 (ASSEMBLE ONE BURST FROM 6 CDBK'S) |
| BURST/CDBK INDX CALCULATION | (K MOD 19) + (K DIV 342) SPECIAL CIRCUIT (2 ACCUMULATORS) | 2 LSB OF (MOD(J,19)+Y) + N, Y=3,2,1 OR 0 DEPENDING ON CURRENT BURST INDEX. |
| NOTES: | SUBTRACT_V = 0 FOR ADS TO SAVE POWER. | CURRENT_BST_IDX RANGES FROM 0 TO 21. N IS THE CURRENT CDBK INDEX. |

Figure 5G

| (9) 4.1.4 (TABLE 1 IN [1]) SACCH OF GSM 05.03 V8.5.0 RELEASE 1999 |||
|---|---|---|
| FOR  K = 0,1,...,455<br>　　　N = 0,1,...,N,N+1,...<br>　　　B = B0 + 4N + (K MOD 4)<br>　　　J = 2((49K) MOD 57) + ((K MOD 8) DIV 4) |||
| PARAMETERS | INTERLEAVER VALUES | DE-INTERLEAVER VALUES |
| N_ADDR_PTR | 4 (ASSEMBLE ONE CDBK FROM 4 BURSTS) | 1 (ASSEMBLE EACH BURST FROM ONE CDBK) |
| BURST INDEX CALCULATION | MOD(K,4) | |
| NOTES: | ONLY DIFFERENCE FROM 3.1.3 (FIGURE 3) IS ONE CDBK MAPPED TO 4 BURSTS INSTEAD OF 8. | IN ORDER TO USE 3.1.3 (FIGURE 3) CONFIGURATION, THE SAME CDBK ADDR POINTER IS INPUT TWICE AS TWO POINTERS. |

Figure 5H

| (10) 4.3.4 (TABLE 1 IN [1]) FACCH/H OF GSM 05.03 V8.5.0 RELEASE 1999 |||
|---|---|---|
| FOR  K = 0,1,...,455<br>     N = 0,1,...,N,N+1,...<br>     B = B0 + 4N + (K MOD 8) - 4((K MOD 8) DIV 6)<br>     J = 2((49K) MOD 57) + ((K MOD 8) DIV 4) |||
| PARAMETERS | INTERLEAVER VALUES | DE-INTERLEAVER VALUES |
| N_ADDR_PTR | 4 (ASSEMBLE ONE CDBK FROM 6 BURSTS) | 1 (ASSEMBLE EACH BURST FROM TWO CDBK'S) |
| BURST INDEX CALCULATION | (K MOD 8) - 4((K MOD 8) DIV 6) = RPT(0,1,2,3,4,5,2,3) | |
| NOTES: | ONLY DIFFERENCE FORM 3.1.3 (FIGURE 3) IS ONE CDBK MAPPED TO 6 BURSTS INSTEAD OF 8. IN ORDER TO USE 3.1.3 (FIGURE 3) CONFIGURATION, WE STILL INPUT 8 ADDR PTRS WITH THE LAST TWO USING PTR 2 AND 3. | IN ORDER TO USE 3.1.3 (FIGURE 3) CONFIGURATION, THE TWO CDBK POINTERS SHOULD BE THE SAME WHEN PROCESSING BURST PAIR (2, 6) AND (3, 7). |

Figure 5l

(11) 5.1.9.1.5 MCS-5 DL HEADER OF GSM 05.03 V8.5.0 RELEASE 1999

THE 100 CODED BITS
FOR  K = 0,1,...,99
     J = 25(K MOD 4) + ((17K) MOD 25)

| PARAMETERS | INTERLEAVER VALUES | DE-INTERLEAVER VALUES |
|---|---|---|
| VI | (0,25,50,75) | (0,25,50,75) |
| VI_SEL | MOD(K,4)  (RPT(0,1,2,3)) | (0R25, 1R25, 2R25, 3R25) (= FLOOR(J/25)) |
| VD, ACS_INPUT | 17 | 28 |
| ACS_INITV | 0 | 0 |
| ACS UPDATE RATE | 1 | 1 |
| ACS SUBTRACT_V | 25 | 700 |
| ADS SUBTRACT_V | 0 | 100 |
| B0 | 0 | 0 |
| B1 | 0 | 0 |
| B2 | 0 | 0 |
| N_ADDR_PTR | 1 | 1 |
| NOTES: | | |

Figure 5J

(12) 5.1.9.1.5 MCS-5 DL DATA OF GSM 05.03 V8.5.0 RELEASE 1999

FROM GSM05.03: "THERE IS NO CLOSED EXPRESSION DESCRIBING THE INTERLEAVER, BUT IT HAS BEEN DERIVED TAKING THE FOLLOWING APPROACH:"

1. A BLOCK INTERLEAVER WITH A 1392 BIT BLOCK SIZE IS DEFINED:
   K = 0:1391;
   B = MOD(K,4);
   D = MOD(K,464);
   J = 3*(2*MOD(25*D,58) + FLOOR(MOD(D,8)/4) + 2*(-1)^B*FLOOR(D/232)) + MOD(K,3);
1. THE DATA BIT POSITIONS BEING MAPPED ONTO J = 156,157,...,191 OF EACH INTERLEAVED BLOCK ARE REMOVED.
2. THE BITS ARE RENUMBERED TO FILL OUT THE GAPS BOTH IN J AND K, WITHOUT CHANGING THE RELATIVE ORDER.

THE RESULTING INTERLEAVER TRANSFORM THE BLOCK OF 1248 CODED BITS INTO A BLOCK OF 1248 INTERLEAVED BITS. (AN EXPLICIT RELATION BETWEEN J' AND K' IS GIVEN IN TABLE 15)

| PARAMETERS | INTERLEAVER VALUES | DE-INTERLEAVER VALUES |
|---|---|---|
| VI | (0,256,158,63,313, 221,151,59,306,214,116,21,302,207,109,17,264,172,102, 10,260,165,67,323) | (0, 832, 416) FOR BURST0, (267, 1099, 683) FOR BURST1, (468, 52, 884) FOR BURST 2, (735, 319, 1151) FOR BURST3. |
| VI_SEL | EVERY 5 OR 6 CIRCULAR COUNTER. (SPECIALLY DESIGNED) | MOD(J, 3) (RPT(0,1,2)) |
| VD, ACS_INPUT | 120 | (936,312) |
| ACS_INITV | 0 | 0 |
| ACS UPDATE RATE | EVERY 5 OR 6 CYCLES. | 1/3. |
| ACS SUBTRACT_V | 348 | 1248 |
| CONTINUED IN FIGURE 5L... | | |

Figure 5K

| CONTINUED FROM FIGURE 5K... | | |
|---|---|---|
| ADS SUBTRACT_V | 348 | 1248 |
| B0 | 0 | ONE BIT IS FOR VERY 12 CYCLES. 001101100100110110011001001 FOR BURST 0. 011011001001001100100010011 FOR BURST 1. 011001001001101100100010011 FOR BURST 2. 110010010011001001001010110 FOR BURST 3. |
| B1 | 0 | 0 |
| B2 | 0 | 0 |
| N_ADDR_PTR | 4 (ASSEMBLE ONE CDBK FROM 4 BURSTS, ONE BURST A TIME.) | 1 (ASSEMBLE ONE BURST FROM A CDBK) |
| NOTES: | 1. VERY SMALL DEDICATED CIRCUIT IS DESIGNED FOR THE IRREGULARITY OF CONTROL SIGNALS. THE 36 BITS PRUNED IN EACH BURST IS AUTOMATICALLY SKIPPED, I.E. FOR EACH BURST, ONLY INDEX 0~155 AND 192~347 ARE PRODUCED. | 1. A DEDICATED HW (BASICALLY A SMALL LUT) FOR ADJUSTING THE PRUNED BITS. THIS ADJUSTMENT IS ACCUMULATING THE LUT CONTENT TO THE ACS CELL EVERY 12 CLOCK CYCLES<br><br>ACS_ADJ =[0 64 65 66 688 689 690 882 258];<br>ACS_ADJ_IDX=[0,2,1,1,5,2,1,4,2,2,4,1,2, 7,6,1,1,4,3,1,4,1,3,4,1,1] FOR BURST 0;<br>ACS_ADJ_IDX=[0 1 1 4 3 1 4 1 3 4 1 1 6 7 2 1 4 2 2 4 1 2 5 1 1 2] FOR BURST 1;<br>ACS_ADJ_IDX=[0 2 1 4 2 2 4 1 2 5 1 1 2 8 3 1 4 1 3 4 1 1 6 1 1 1] FOR BURST 2;<br>ACS_ADJ_IDX=[0 1 4 1 3 4 1 1 6 1 1 1 6 7 2 4 1 2 5 1 1 2 5 1 1 5] FOR BURST 3;<br>2. THE J INDEX 156~191 OF EACH BURST IS LEFT FOR 36 HEADER AND OTHER BITS. SEE API CHAPTER FOR BURST MAPPING CODING STRATEGIES. |

Figure 5L

(13) 5.1.9.2.4 MCS-5 UL HEADER OF GSM 05.03 V8.5.0 RELEASE 1999

THE 136 CODED BITS,
FOR K = 0,1,...,135
    J = 34(K MOD 4) + 2((11K) MOD 17) + [(K MOD 8)/4]

| PARAMETERS | INTERLEAVER VALUES | DE-INTERLEAVER VALUES |
|---|---|---|
| VI | (0,34,68,102) | (0,17,34,51) |
| VI_SEL | RPT(0,1,2,3) | (0R34, 1R34, 2R34, 3R34) (= FLOOR(J/34)) |
| VD, ACS_INPUT | 22 | (68,116) |
| ACS_INITV | 0 | 68 |
| ACS UPDATE RATE | 1 | 1 |
| ACS SUBTRACT_V | 37 | 136 |
| ADS SUBTRACT_V | 0 | 136 |
| B0 | 0 | RPT(01) |
| B1 | 0 | 0 |
| B2 | 0 | 0 |
| N_ADDR_PTR | 1 | 1 |
| NOTES: | CONNECT CIN = [(K MOD 8) DIV 4] (K[B2]) | |

Figure 5M

(14) 5.1.11.1.5 MCS-7 DL HEADER OF GSM 05.03 V8.5.0 RELEASE 1999

THE 124 CODED BITS OF THE HEADER,
FOR  K = 0,1,...,123
    J = 31(K MOD 4) + ((17K) MOD 31)

| PARAMETERS | INTERLEAVER VALUES | DE-INTERLEAVER VALUES |
|---|---|---|
| VI | (0,31,62,93) | (0,93,62,31) |
| VI_SEL | MOD(K,4)  (RPT(0,1,2,3)) | (0R31, 1R31, 2R31, 3R31) (= FLOOR(J/31)) |
| VD, ACS_INPUT | 17 | (104) |
| ACS_INITV | 0 | 0 |
| ACS UPDATE RATE | 1 | 1 |
| ACS SUBTRACT_V | 31 | 124 |
| ADS SUBTRACT_V | 0 | 124 |
| B0 | 0 | 0 |
| B1 | 0 | 0 |
| B2 | 0 | 0 |
| N_ADDR_PTR | 1 | 1 |
| NOTES: | | |

Figure 5N

| (15) 5.1.11.1.5 MCS-7 DL DATA OF GSM 05.03 V8.5.0 RELEASE 1999 |||
|---|---|---|
| $K = 0,1,...,1223$ <br> $J = 306(K\ MOD\ 4) + 3((44K)\ MOD\ 102 + (K\ DIV\ 4)\ MOD\ 2) + (K + 2 - (K\ DIV\ 408))\ MOD\ 3$ |||
| PARAMETERS | INTERLEAVER VALUES | DE-INTERLEAVER VALUES |
| VI | (2,132,265,92,0, 133, 266,90,1,134,264,91) | 4*(204,102,0,255,153,51) FOR BURST 1 <br> 4*(242 140 38 293 191 89) FOR BURST 2 <br> 4*(280 178 76 229 127 25) FOR BURST 3 <br> 4*(216 114 12 267 165 63) FOR BURST 4 |
| VI_SEL | MOD (MOD (K,12)+FLOOR( K/408 )*8, 12 ) | MOD(J,6)  (RPT(0,1,2,3,4,5)) |
| VD, ACS_INPUT | (225,219) | 4*(40,142,40,142) |
| ACS_INITV | 0 | 0 |
| ACS UPDATE RATE | ¼ | 1/6 |
| ACS SUBTRACT_V | 306 | 4*306 |
|  |  |  |
| ADS SUBTRACT_V | 306 | 4*306 |
| B0 <br><br><br><br><br><br>CONTINUED IN FIGURE 5P... | K[B2] (RPT(00001111 )) | (EVERY BIT LAST 3 CYCLES, STARTS AFTER FIRST 6 CYCLES) <br> FOR BURST 0: <br> 1110011011011001101101100111100110011100110011100110110110011011001101101100111100110011100110 <br> FOR BURST 1: <br> 1001101101100110110110011110011001111001100111001101101100110110110011110011001111001100111100110011110011001111001 1011 |

Figure 5O

| | | |
|---|---|---|
| CONTINUED FROM FIGURE 5P...<br><br>B0 | | FOR BURST 2:<br>0110110110011110011001111001101101<br>1110011011011001101101100110110110<br>1001111001100111001100111100110<br>1101<br>FOR BURST 3:<br>1011011001111001001111001100111<br>1001101101100110110110011110011110<br>0111100110011110011011011001111001101<br>0110 |
| B1 | 0 | RPT(000111) |
| B2 | 0 | RPT(000111) |
| N_ADDR_PTR | 4 (ASSEMBLE ONE CDBK FROM 4 BURSTS. EVERY 4 BITS ARE FROM BURST 0,1,2,AND 3 RESPECTIVELY.) | 1 (ASSEMBLE EACH BURST FROM A SINGLE CDBK) |
| CDBK/BURST ADDR CALCULATION | BURST_IDX = MOD(K,4) | BIT_OFST = 0,1,2,3 FOR BURST 0,1,2,3 RESPECTIVELY. |
| NOTES: | | |

Figure 5P

(16) 5.1.11.2.4 MCS-7 UL HEADER OF GSM 05.03 V8.5.0 RELEASE 1999

THE 160 CODED BITS OF THE HEADER,
FOR  K = 0,1,...,159
    J = 40(K MOD 4) + 2((13(K DIV 8)) MOD 20) + ((K MOD 8) DIV 4)

| PARAMETERS | INTERLEAVER VALUES | DE-INTERLEAVER VALUES |
|---|---|---|
| VI | (0,40 80 120) | (0,1,2,3) |
| VI_SEL | RPT(0,1,2,3) (=K[B1B0]) | (0R40, 1R40, 2R40, 3R40) (= FLOOR(J/31)) |
| VD, ACS_INPUT | 26 | (4,132) |
| ACS_INITV | 0 | 0 |
| ACS UPDATE RATE | 1/8 | 1 |
| ACS SUBTRACT_V | 40 | 160 |
| ADS SUBTRACT_V | 0 | 0 |
| B0 | 0 | RPT(0,1) |
| B1 | 0 | 0 |
| B2 | 0 | 0 |
| N_ADDR_PTR | 1 | 1 |
| NOTES: | CARRY_IN = FLOOR(MOD(K,8)/4) (=K[B2]) | |
| NOTES: | | |

Figure 5Q

(17) 5.1.12.1.5 MCS-8, DL DATA OF GSM 05.03 V8.5.0 RELEASE 1999

$K = 0,1,...,1223$
$J = 306(2(K \text{ DIV } 612) + (K \text{ MOD } 2)) + 3((74K) \text{ MOD } 102 + (K \text{ DIV } 2) \text{ MOD } 2) + (K + 2 - (K \text{ DIV } 204)) \text{ MOD } 3$

| PARAMETERS | INTERLEAVER VALUES | DE-INTERLEAVER VALUES |
|---|---|---|
| VI | (2,0,4,5,0,1,5,3,1,2,3,4) | 2*(204,102,0,255,153,51) FOR BURST 0<br>2*(280,178,76,229,127,25) FOR BURST 1<br>SAME AS BURST 0 FOR BURST 2<br>SAME AS BURST 1 FOR BURST 3 |
| VI_SEL | MOD (MOD (K,12)+FLOOR( K/204 )*8, 12 ) | RPT(0,1,2,3,4,5) |
| VD, ACS_INPUT | 222 | 2*(20,122) |
| ACS_INITV | 0 | 0 |
| ACS UPDATE RATE | 1 | 1/6 |
| ACS SUBTRACT_V | 306 | 2*306 |
| ADS SUBTRACT_V | 0 | 2*306 |
| B0<br><br>CONTINUED IN FIGURE 5S... | 0 | (EVERY BIT LAST 3 CYCLES, STARTS AFTER FIRST 6 CYCLES)<br>FOR BURST 0:<br>111110111101111011110111101110111101111011110111011111101101111110111011111011011111011<br>FOR BURST 1:<br>110111101111011101111011111101101111101101111101101111110110111111011110111101111011101110 |

Figure 5R

| | | |
|---|---|---|
| CONTINUED FROM FIGURE 5R...<br><br>B0 | | FOR BURST 2:<br>1111101111011110111011111011111101<br>1110111101111011110111111011101111<br>1110110111110110111111011011111<br>1011<br>FOR BURST 3:<br>1101111011110111011110111111011<br>0111111011011111011011111101101<br>1111101101111101111011110111101<br>1110 |
| B1 | 0 | RPT(000111) (=MOD(FLOOR(J/3),2) |
| B2 | 0 | RPT(000111) (=MOD(FLOOR(J/3),2) |
| N_ADDR_PTR | 4 (ASSEMBLE ONE CDBK FROM 4 BURSTS. THE 1ST 612 BITS ARE FROM BURST 0 AND 1. THE 2ND 612 BITS ARE FROM BURST 2 AND 3.) | 1 (ASSEMBLE EACH BURST FROM A SINGLE CDBK) |
| CDBK/BURST ADDR CALCULATION | BURST_IDX = K[B0]+FLOOR( K/612)*2 (RPT(0,1) 306 TIMES + RPT(2,3) 306 TIMES) | BIT_OFST = 0,1,612,613 FOR BURST 0,1,2,3 RESPECTIVELY. |
| NOTES: | | |

Figure 5S

(18) WCDMA 2ND INTERLEVER OF 3GPP TS 25.212-V.3.5.0 (2000-12), RELEASE 1999

THE 2ND INTERLEAVING IS A BLOCK INTERLEAVER AND CONSISTS OF BITS INPUT TO A MATRIX WITH PADDING, THE INTER-COLUMN PERMUTATION FOR THE MATRIX AND BITS OUTPUT FROM THE MATRIX WITH PRUNING. THE BITS INPUT TO THE BLOCK INTERLEAVER ARE DENOTED BY $u_{p,1}, u_{p,2}, u_{p,3}, ..., u_{p,U}$, WHERE P IS PHCH NUMBER AND U IS THE NUMBER OF BITS IN ONE RADIO FRAME FOR ONE PHCH. THE OUTPUT BIT SEQUENCE FROM THE BLOCK INTERLEAVER IS DERIVED AS FOLLOWS:

(1) ASSIGN C2 = 30 TO BE THE NUMBER OF COLUMNS OF THE MATRIX. THE COLUMNS OF THE MATRIX ARE NUMBERED 0, 1, 2, ..., C2 - 1 FROM LEFT TO RIGHT.

(2) DETERMINE THE NUMBER OF ROWS OF THE MATRIX, R2, BY FINDING MINIMUM INTEGER R2 SUCH THAT:

U ≤ R2 × C2.

THE ROWS OF RECTANGULAR MATRIX ARE NUMBERED 0, 1, 2, ..., R2 - 1 FROM TOP TO BOTTOM.

(3) WRITE THE INPUT BIT SEQUENCE $u_{p,1}, u_{p,2}, u_{p,3}, ..., u_{p,U}$ INTO THE R2 × C2 MATRIX ROW BY ROW STARTING WITH BIT $y_{p,1}$ IN COLUMN 0 OF ROW 0:

$$\begin{bmatrix} y_{p,1} & y_{p,2} & y_{p,3} & \cdots & y_{p,C2} \\ y_{p,(C2+1)} & y_{p,(C2+2)} & y_{p,(C2+3)} & \cdots & y_{p,(2 \times C2)} \\ \vdots & \vdots & \vdots & \cdots & \vdots \\ y_{p,((R2-1) \times C2+1)} & y_{p,((R2-1) \times C2+2)} & y_{p,((R2-1) \times C2+3)} & \cdots & y_{p,(R2 \times C2)} \end{bmatrix}$$

WHERE $y_{p,k} = u_{p,k}$ FOR K = 1, 2, ..., U AND IF R2 × C2 > U, THE DUMMY BITS ARE PADDED SUCH THAT $y_{p,k}$ = 0 OR 1 FOR K = U + 1, U + 2, ..., R2 × C2. THESE DUMMY BITS ARE PRUNED AWAY FROM THE OUTPUT OF THE MATRIX AFTER THE INTER-COLUMN PERMUTATION.

Figure 6A

CONTINUED FROM FIGURE 6A...

(4) PERFORM THE INTER-COLUMN PERMUTATION FOR THE MATRIX BASED ON THE PATTERN $\langle P2(j) \rangle_{j \in \{0,1,\ldots,C2-1\}}$ THAT IS SHOWN IN THE END OF THIS DESCRIPTION, WHERE P2(J) IS THE ORIGINAL COLUMN POSITION OF THE J-TH PERMUTED COLUMN. AFTER PERMUTATION OF THE COLUMNS, THE BITS ARE DENOTED BY $y'_{p,k}$.

$$\begin{bmatrix} y'_{p,1} & y'_{p,(R2+1)} & y'_{p,(2\times R2+1)} & \cdots & y'_{p,((C2-1)\times R2+1)} \\ y'_{p,2} & y'_{p,(R2+2)} & y'_{p,(2\times R2+2)} & \cdots & y'_{p,((C2-1)\times R2+2)} \\ \vdots & \vdots & \vdots & \cdots & \vdots \\ y'_{p,R2} & y'_{p,(2\times R2)} & y'_{p,(3\times R2)} & \cdots & y'_{p,(C2\times R2)} \end{bmatrix}$$

(5) THE OUTPUT OF THE BLOCK INTERLEAVER IS THE BIT SEQUENCE READ OUT COLUMN BY COLUMN FROM THE INTER-COLUMN PERMUTED R2 × C2 MATRIX. THE OUTPUT IS PRUNED BY DELETING DUMMY BITS THAT WERE PADDED TO THE INPUT OF THE MATRIX BEFORE THE INTER-COLUMN PERMUTATION, I.E. BITS $y'_{p,k}$ THAT CORRESPONDS TO BITS $y_{p,k}$ WITH K>U ARE REMOVED FROM THE OUTPUT. THE BITS AFTER 2ND INTERLEAVING ARE DENOTED BY $v_{p,1}, v_{p,2}, \ldots, v_{p,U}$, WHERE $V_{P,1}$ CORRESPONDS TO THE BIT $y'_{p,k}$ WITH SMALLEST INDEX K AFTER PRUNING, $V_{P,2}$ TO THE BIT $y'_{p,k}$ WITH SECOND SMALLEST INDEX K AFTER PRUNING, AND SO ON.

(6) THE COLUMN PERMUTATION PATTERN:

TABLE OF PARAMETERS AND PARAMETER VALUES USED WITH WCDMA 2ND INTERLEAVER OF 3GPP TS 25.212-V.3.5.0 (2000-12), RELEASE 1999

| PARAMETERS | INTERLEAVER VALUES | DE-INTERLEAVER VALUES |
|---|---|---|
| VI | (0, 20, 10, 5, 15, 25, 3, 13, 23, 8, 18, 28, 1, 11, 21, 6, 16, 26, 4, 14, 24, 19, 9, 29, 12, 2, 7, 22, 27, 17) | (0, 12, 25, 6, 18, 3, 15, 26, 9, 22, 2, 13, 24, 7, 19, 4, 16, 29, 10, 21, 1, 14, 27, 8, 20, 5, 17, 28, 11, 23)*NUM_ROW |
| VI_SEL | NUM_ROW = FLOOR(BLOCK_LTH/30);<br>NUM_FULL_COLUMN<br>   = BLOCK_LTH - NUM_ROW*30;<br>VI_SEL=0;<br>IF VI(VI_SEL)<NUM_FULL_COLUMN<br>   FOR EVERY NUM_ROW+1 CYCLES,<br>      VI_SEL = VI_SEL+1;<br>      ACS RESET;<br>ELSE<br>   FOR EVERY NUM_ROW CYCLES,<br>      VI_SEL = VI_SEL+1;<br>      ACS RESET;<br>END | MOD(J, 30)<br>RPT(0,1,2,...,29) |

NOTES FOR INTERLEAVER: VI_SEL IS A COUNTER FROM 0:29 AND IS UPDATED EVERY COL_L$^{TH}$ CYCLES, WHERE COL_L$^{TH}$ COULD BE EITHER N_ROW OR N_ROW+1. THE ALGORITHM IS:
(INITIALIZATION) = INPUT PARAMETERS
END
NUM_ROW = NUM_FULL_COL = VI_SEL = -1
FOR VI_SEL = 0:29
ACS = 0;
IF
ELSE
END (FOR KK = 1 = COL_L$^{TH}$, DO ACS AND OUTPUT UPDATE)
CONTINUED IN FIGURE 6D...

Figure 6C

| CONTINUED FROM FIGURE 6C... | | |
|---|---|---|
| NOTES FOR DE-INTERLEAVER: FOR COL_IDX = 1:30, ACS = 0; VI_SEL = VI_SEL + 1; IF VI(VI_SEL) < NUM_FULL_COL COL_L$^{TH}$ = NUM_ROW +1; ELSE COL_L$^{TH}$ = NUM_ROW; END (FOR KK = 1 = COL_L$^{TH}$, DO; END FOR) | | |
| PARAMETERS | INTERLEAVER VALUES | DE-INTERLEAVER VALUES |
| VD | 30 | 1 |
| ACS_INITV | 0 | 0 |
| ACS UPDATE RATE | 1/1 (EVERY CYCLE) ACS RESET AT EVERY NUM_ROW OR NUM_ROW-1 CYCLES. | 1/30 (EVERY 30 CYCLES) |
| ACS SUBTRACT_V | >19200 FOR UE 384K CLASS. | >640 FOR UE 384K CLASS. |
| ADS SUBTRACT_V | >19200 FOR UE 384K CLASS. | >19200 FOR UE 384K CLASS. |
| B0 | 0 | 0 |
| B1 | 0 | 0 |
| B2 | 0 | 0 |
| N_ADDR_PTR | 1 | 1 |
| NOTES FOR DE-INTERLEAVER: THE ADJUST VALUE ADDED TO ADS FROM PRUNING ADJUST BLOCK IS OBTAINED BY A 30 ELEMENT LUT INDEXED BY VI_SEL. THIS LUT IS BASED ON THE NUMBER OF FULL COLUMN (N_FC) AND THUS IS DIFFERENT FOR DIFFERENT NUMBER OF FULL COLUMNS WHEN THE BLOCK SIZE IS NOT DIVISIBLE BY 30 (THE CASE DUMMY BITS EXIST). SEE FIGS. 6E & 6F. | | |

Figure 6D

ADS ADJUSTMENT VALUES FOR WCDMA 2ND DE-INTERLEAVING

| N_FC | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 1 | 0 | 1 | 1 | 1 | 1 | 1 | 1 | 1 | 1 | 1 | 1 | 1 | 1 | 1 | 1 |
| 2 | 0 | 1 | 2 | 1 | 2 | 1 | 2 | 2 | 1 | 2 | 1 | 2 | 2 | 1 | 2 |
| 3 | 0 | 1 | 2 | 1 | 2 | 1 | 2 | 3 | 1 | 2 | 1 | 2 | 2 | 1 | 2 |
| 4 | 0 | 2 | 3 | 1 | 3 | 1 | 3 | 4 | 2 | 3 | 1 | 3 | 3 | 2 | 3 |
| 5 | 0 | 2 | 4 | 1 | 3 | 1 | 3 | 5 | 2 | 4 | 1 | 3 | 4 | 2 | 4 |
| 6 | 0 | 3 | 5 | 2 | 4 | 1 | 4 | 6 | 3 | 5 | 1 | 4 | 5 | 3 | 5 |
| 7 | 0 | 3 | 6 | 2 | 5 | 1 | 4 | 7 | 3 | 6 | 1 | 4 | 6 | 3 | 6 |
| 8 | 0 | 3 | 6 | 2 | 5 | 1 | 4 | 7 | 3 | 6 | 1 | 4 | 6 | 3 | 6 |
| 9 | 0 | 4 | 7 | 2 | 6 | 1 | 5 | 8 | 3 | 7 | 1 | 5 | 7 | 3 | 7 |
| 10 | 0 | 4 | 8 | 2 | 6 | 1 | 5 | 9 | 3 | 7 | 1 | 5 | 8 | 3 | 7 |
| 11 | 0 | 5 | 9 | 3 | 7 | 2 | 6 | 10 | 4 | 8 | 1 | 6 | 9 | 4 | 8 |
| 12 | 0 | 5 | 10 | 3 | 8 | 2 | 7 | 11 | 4 | 9 | 1 | 6 | 10 | 4 | 9 |
| 13 | 0 | 5 | 11 | 3 | 8 | 2 | 7 | 12 | 4 | 9 | 1 | 6 | 10 | 4 | 9 |
| 14 | 0 | 6 | 12 | 3 | 9 | 2 | 8 | 13 | 5 | 10 | 1 | 7 | 11 | 4 | 10 |
| 15 | 0 | 6 | 13 | 3 | 9 | 2 | 8 | 14 | 5 | 11 | 1 | 7 | 12 | 4 | 10 |
| 16 | 0 | 7 | 14 | 4 | 10 | 2 | 9 | 15 | 6 | 12 | 1 | 8 | 13 | 5 | 11 |
| 17 | 0 | 7 | 15 | 4 | 11 | 2 | 9 | 16 | 6 | 13 | 1 | 8 | 14 | 5 | 12 |
| 18 | 0 | 7 | 15 | 4 | 11 | 2 | 9 | 16 | 6 | 13 | 1 | 8 | 14 | 5 | 12 |
| 19 | 0 | 8 | 16 | 4 | 12 | 2 | 10 | 17 | 6 | 14 | 1 | 9 | 15 | 5 | 13 |
| 20 | 0 | 8 | 17 | 4 | 12 | 2 | 10 | 18 | 6 | 15 | 1 | 9 | 16 | 5 | 13 |
| 21 | 0 | 9 | 18 | 5 | 13 | 3 | 11 | 19 | 7 | 16 | 2 | 10 | 17 | 6 | 14 |
| 22 | 0 | 9 | 19 | 5 | 14 | 3 | 12 | 20 | 7 | 17 | 2 | 10 | 18 | 6 | 15 |
| 23 | 0 | 9 | 19 | 5 | 14 | 3 | 12 | 20 | 7 | 17 | 2 | 10 | 18 | 6 | 15 |
| 24 | 0 | 10 | 20 | 5 | 15 | 3 | 13 | 21 | 8 | 18 | 2 | 11 | 19 | 6 | 16 |
| 25 | 0 | 10 | 21 | 5 | 15 | 3 | 13 | 22 | 8 | 19 | 2 | 11 | 20 | 6 | 16 |
| 26 | 0 | 11 | 22 | 6 | 16 | 3 | 14 | 23 | 9 | 20 | 2 | 12 | 21 | 7 | 17 |
| 27 | 0 | 11 | 23 | 6 | 17 | 3 | 14 | 24 | 9 | 21 | 2 | 12 | 22 | 7 | 18 |
| 28 | 0 | 11 | 23 | 6 | 17 | 3 | 14 | 24 | 9 | 21 | 2 | 12 | 22 | 7 | 18 |
| 29 | 0 | 12 | 24 | 6 | 18 | 3 | 15 | 25 | 9 | 22 | 2 | 13 | 23 | 7 | 19 |

Figure 6E

ADS ADJUSTMENT VALUES FOR WCDMA 2ND DE-INTERLEAVING

| N_FC | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 | 1 |
| 2 | 1 | 2 | 2 | 1 | 2 | 1 | 2 | 2 | 1 | 2 | 1 | 2 | 2 | 1 | 2 |
| 3 | 1 | 2 | 3 | 1 | 2 | 1 | 2 | 3 | 1 | 2 | 1 | 2 | 3 | 1 | 2 |
| 4 | 1 | 3 | 4 | 2 | 3 | 1 | 3 | 4 | 2 | 3 | 1 | 3 | 4 | 2 | 3 |
| 5 | 1 | 3 | 5 | 2 | 4 | 1 | 3 | 5 | 2 | 4 | 1 | 3 | 5 | 2 | 4 |
| 6 | 2 | 4 | 6 | 3 | 5 | 1 | 4 | 6 | 3 | 5 | 2 | 4 | 6 | 3 | 5 |
| 7 | 2 | 5 | 7 | 3 | 6 | 1 | 4 | 7 | 3 | 6 | 2 | 5 | 7 | 3 | 6 |
| 8 | 2 | 5 | 8 | 3 | 6 | 1 | 4 | 8 | 3 | 6 | 2 | 5 | 8 | 3 | 6 |
| 9 | 2 | 6 | 9 | 4 | 7 | 1 | 5 | 9 | 3 | 7 | 2 | 6 | 9 | 4 | 7 |
| 10 | 2 | 6 | 10 | 4 | 7 | 1 | 5 | 10 | 3 | 7 | 2 | 6 | 10 | 4 | 8 |
| 11 | 3 | 7 | 11 | 5 | 8 | 1 | 6 | 11 | 4 | 8 | 3 | 7 | 11 | 5 | 9 |
| 12 | 3 | 8 | 12 | 5 | 9 | 1 | 7 | 12 | 4 | 9 | 3 | 8 | 12 | 5 | 10 |
| 13 | 3 | 8 | 13 | 5 | 9 | 1 | 7 | 13 | 4 | 9 | 3 | 8 | 13 | 5 | 10 |
| 14 | 3 | 9 | 14 | 6 | 10 | 1 | 8 | 14 | 5 | 10 | 3 | 9 | 14 | 6 | 11 |
| 15 | 3 | 9 | 15 | 6 | 11 | 1 | 8 | 15 | 5 | 11 | 3 | 9 | 15 | 6 | 12 |
| 16 | 3 | 10 | 16 | 7 | 12 | 1 | 9 | 16 | 6 | 12 | 4 | 10 | 16 | 7 | 13 |
| 17 | 3 | 10 | 17 | 7 | 13 | 1 | 9 | 17 | 6 | 13 | 4 | 11 | 17 | 7 | 14 |
| 18 | 3 | 10 | 17 | 7 | 13 | 1 | 9 | 17 | 6 | 13 | 4 | 11 | 17 | 7 | 14 |
| 19 | 3 | 11 | 18 | 7 | 14 | 1 | 10 | 18 | 6 | 14 | 4 | 12 | 18 | 8 | 15 |
| 20 | 3 | 11 | 19 | 7 | 14 | 1 | 10 | 19 | 6 | 14 | 4 | 12 | 19 | 8 | 16 |
| 21 | 4 | 12 | 20 | 8 | 15 | 1 | 11 | 20 | 7 | 15 | 5 | 13 | 20 | 9 | 17 |
| 22 | 4 | 13 | 21 | 8 | 16 | 1 | 11 | 21 | 7 | 16 | 5 | 14 | 21 | 9 | 18 |
| 23 | 4 | 13 | 22 | 8 | 16 | 1 | 11 | 21 | 7 | 16 | 5 | 14 | 22 | 9 | 18 |
| 24 | 4 | 14 | 23 | 9 | 17 | 1 | 12 | 22 | 7 | 17 | 5 | 15 | 23 | 10 | 19 |
| 25 | 4 | 14 | 24 | 9 | 18 | 1 | 12 | 23 | 7 | 17 | 5 | 15 | 24 | 10 | 20 |
| 26 | 4 | 15 | 25 | 10 | 19 | 1 | 13 | 24 | 8 | 18 | 5 | 16 | 25 | 11 | 21 |
| 27 | 4 | 15 | 26 | 10 | 20 | 1 | 13 | 25 | 8 | 19 | 5 | 16 | 26 | 11 | 22 |
| 28 | 4 | 15 | 27 | 10 | 20 | 1 | 13 | 25 | 8 | 19 | 5 | 16 | 26 | 11 | 22 |
| 29 | 4 | 16 | 28 | 10 | 21 | 1 | 14 | 26 | 8 | 20 | 5 | 17 | 27 | 11 | 23 |

Figure 6F

3GPP2 C.S0002-C VERSION 1.0

2.1.3.1.7 BLOCK INTERLEAVING

FOR I=0,...,N-1

THE DATA IS READ OUT AT THE ADDRESS: $AI = 2^M(I\ MODJ) + BRO_M(FLOOR(I/J))$
WHERE N,M,J ARE GIVEN IN TABLE 2.1.3.1.7.1
AND $BRO_M(Y)$ INDICATES THE BIT-REVERSED M-BIT VALUE OF Y (I.E., $BRO_3(6) = 3$).

| PARAMETERS | INTERLEAVER VALUES | DE-INTERLEAVER VALUES |
|---|---|---|
| VI | TABLE OF DIMENSION $2^M$ $BRO_M(0,1,...,(2^M-1))$ (SEE NOTE BELLOW) | TABLE OF DIMENSION $2^M$ $J^* BRO_M(0,1,...,(2^M-1))$ (SEE NOTE BELLOW) |
| VI_SEL | FLOOR(I/J) | $MOD(AI, 2^M-1)$ $(RPT(0,...,2^M-1))$ IF LOOK UP TABLE |
| VD | $2^M$ | 1 |
| ACS_INITV | 0 | 0 |
| ACS UPDATE RATE | 1 | $1/2^M$ |
| SUBTRACT_V | N | N |
| B0 | 0 | 0 |
| B1 | 0 | 0 |
| B2 | 0 | 0 |
| N_ADDR_PTR | 1(ASSEMBLE ONE BURST FROM ONE CDBK) | 1(ASSEMBLE ONE CDBK FROM ONE BURST) |
| BURST/CDBK_I DX CALCULATION | UNIQUE BURST POINTER NO BIT OFFSET | UNIQUE CDBK POINTER NO BIT OFFSET |
| NOTES | THE VI TABLES CAN EASILY BE REPLACED BY AN INITIAL VALUE GENERATOR MODULE AS SHOWN IN FIGURE 2. IN SUCH CASE, BOTH VI AND VI_SEL ARE NOT USED. | |

Figure 7A

3GPP2 C.S0002-C VERSION 1.0

3.1.3.1.7.1.2 FORWARD-BACKWARDS BIT-REVERSAL ORDER INTERLEAVER

FOR I=0,...,N-1
THE INTERLEAVED SYMBOLS ARE READ OUT AT THE ADRESS:

$AI = 2^M(I/2 \text{ MODJ}) + BRO_M(FLOOR(I/2/J))$ FOR I=0,2,....,N-2

$AI = 2^M((N-(I+1)/2) \text{ MODJ}) + BRO_M(FLOOR((N-(I+1)/2/J))$ FOR I=1,3,....,N-1

WHERE N,M,J ARE GIVEN IN TABLE 3.1.3.1.7-1
AND $BRO_M(Y)$ INDICATES THE BIT-REVERSED M-BIT VALUE OF Y(I.E., $BRO_3(6) = 3$).

| PARAMETERS | INTERLEAVER VALUES | DE-INTERLEAVER VALUES |
|---|---|---|
| VI | TABLE OF DIMENSION $2^M$ WITH THE VALUES $BRO_M(0, 2^M-1, 1, 2^M-2, 2, 2^M-3,..., 2^{M-1}-1, 2^{M-1})$ (SEE NOTE BELLOW) | TABLE OF DIMENSION $2^M$ WITH THE VALUES J* $BRO_M(0, 2^M-1, 1, 2^M-2, 2, 2^M-3,..., 2^{M-1}-1, 2^{M-1})$ (SEE NOTE BELLOW) |
| VI_SEL | 2 * FLOOR(I/2/J) + MOD(I,2) | MOD(AI, $2^M$) (RPT(0,1,..., $2^M-1$)) |
| VD | $2^M$ FOR ACS0, N-$2^M$ FOR ACS1 | 2 FOR ACS0, N-2 FOR ACS1 |
| ACS_INITV | 0 FOR ACS0, N-$2^M$ FOR ACS1 | 0 FOR ACS0, J-1 FOR ACS1 |
| ACS UPDATE RATE | 1/2 | 1/$2^M$ |
| SUBTRACT_V | N | N |
| B0 | MOD(I,2) (RPT(0,1)) | MOD(AI,2) (RPT(0,1)) |
| B1 | 0 | 0 |
| B2 | MOD(I,2) (RPT(0,1)) | MOD(AI,2) (RPT(0,1)) |
| N_ADDR_PTR | 1(ASSEMBLE ONE BURST FROM ONE CDBK) | 1(ASSEMBLE ONE CDBK FROM ONE BURST) |
| BURST/CDBK_IDX CALCULATION | UNIQUE BURST POINTER NO BIT OFFSET | UNIQUE BURST POINTER NO BIT OFFSET |
| NOTES: THE INTERLEAVER WORKS ON THE TWO ACS TO DEAL ALTERNATIVELY WITH ODD AND EVEN NUMBERS. THE VI TABLES CAN EASILY BE REPLACED BY AN INITIAL VALUE GENERATOR MODULE AS SHOWN IN FIGURE 2. IN THIS CASE, BOTH VI AND VI_SEL ARE NOT USED. | | |

Figure 7B

3GPP2 C.S0002-C VERSION 1.0

2.1.3.1.7 BLOCK INTERLEAVING FOR REVERSE TRAFFIC CHANNEL WITH RADIO CONFIGURATION 1 AND 2
ARRAY WITH 32 ROWS AND 18 COLUMNS (I.E. 576 CELLS)
SYMBOLS ARE WRITTEN BY COLUMNS, OUPUT BY ROWS.
THE INTERLEAVER ROWS SHALL BE OUPUT IN THE FOLLOWING ORDER:
AT 9600 OR 14400BPS:
1 2 3 4 5 6 7 8 9 10 11 12 13 14 15 16 17 18 19 20 21 22 23 24 25 26 27 28 29 30 31 32
AT 4800 OR 7200 BPS:
1 3 2 4 5 7 6 8 9 11 10 12 13 15 14 16 17 19 18 20 21 23 22 24 25 27 26 28 29 31 30 32
AT 2400 OR 3600 BPS:
1 5 2 6 3 7 4 8 9 13 10 14 11 15 12 16 17 21 18 22 19 23 20 24 25 29 26 30 27 31 28 32
AT 1200 OR 1800 BPS:
1 9 2 10 3 11 4 12 5 13 6 14 7 15 8 16 17 25 18 26 19 27 20 28 21 29 22 30 23 31 24 32

| PARAMETERS | INTERLEAVER VALUES | DE-INTERLEAVER VALUES |
|---|---|---|
| VI | TABLE OF DIMENSION 32 WITH ITS VALUES EQUAL TO THE ORDER OF READING OF ROWS (SEE NOTE BELLOW) | TABLE OF DIMENSION 32 WITH ITS VALUES EQUAL TO THE ORDER OF READING OF ROWS (SEE NOTE BELLOW) |
| VI_SEL | FLOOR(J/18) | FLOOR(I/32) |
| VD | 32 | 18 |
| ACS_INITV | 0 | 0 |
| ACS UPDATE RATE | 1 | 1 |
| SUBTRACT_V | 576 | 576 |
| B0 | 0 | 0 |
| B1 | 0 | 0 |
| B2 | 0 | 0 |
| N_ADDR_PTR | 1(ASSEMBLE ONE BURST FROM ONE CDBK) | 1(ASSEMBLE ONE CDBK FROM ONE BURST) |
| BURST/CDBK_IDX CALCULATION | UNIQUE BURST POINTER NO BIT OFFSET | UNIQUE BURST POINTER NO BIT OFFSET |

NOTES: THE VI TABLES CAN EASILY BE REPLACED BY A GENERATOR MODULE AS SHOWN IN FIGURE 2. IN THIS CASE, BOTH VI AND VI_SEL ARE NOT USED. THE VALUES OF VI TABLE INDICATE THE RIGHT-CIRCULAR-SHIFTED M-BIT VALUE OF Y (RSHFTM(Y) I.E., RSHFT4(3) = 9).WITH M=1 (NO SHIFT) AT 9600 OR 14400 BPS, M=2 AT 4800 OR 7200 BPS, M=3 AT 2400 OR 3600 BPS AND M=4 AT 1200 OR 1800 BPS.

Figure 7C

3GPP2 C.S0002-C VERSION 1.0

3.1.3.1.7.2 SPREADING RATE 3 INTERLEAVING (IMPLEMENTATION WITH 3 ACS)

THE BLOCK INTERLEAVER SHALL DEMULTIPLEX ITS INPUT SYMBOLS INTO THREE BLOCKS WITH N/3 SYMBOLS EACH.
THE SYMBOLS INPUT TO BLOCK INTERLEAVER K (K = 0, 1, 2) ARE WRITTEN SEQUENTIALLY INTO ADDRESSES 0 TO N/3 – 1. THE INTERLEAVED SYMBOLS ARE READ OUT IN A PERMUTED ORDER, WITH THE I-TH ADDRESS BEING READ FROM ADDRESS AI, AS FOLLOWS:

AI=M[(I+FLOOR(KN/9))MODJ] +BROM[FLOOR[(+FLOOR(KN/9))MOD(N/3))J]]
WHERE I = 0 TO N/3 – 1,
M AND J ARE GIVEN IN TABLE 3.1.3.1.7-1 USING INTERLEAVER BLOCK SIZE N/3
X INDICATES THE LARGEST INTEGER LESS THAN OR EQUAL TO X, AND
BROM(Y) INDICATES THE BIT-REVERSED M-BIT VALUE OF Y (I.E., $BRO_3(6)$ = 3).
THE THREE INTERLEAVED BLOCK OUTPUTS SHALL THEN BE MULTIPLEXED TOGETHER.

| PARAMETERS | INTERLEAVER VALUES | DE-INTERLEAVER VALUES |
|---|---|---|
| VI | TABLE OF DIMENSION $2^M$ WITH THE VALUES $BRO_M(0,1,...,(2^M-1))$ (SEE NOTE BELLOW) | TABLE OF DIM $2^M$ WITH THE VALUES $J*BRO_M(0,1,..., 2^M-1)$ (SEE NOTE BELLOW) |
| VI_SEL | FLOOR(MOD(I+FLOOR(KN/9),N/3)/J), FOR $ACS_K$ K=0,1,2 | MOD(FLOOR(AI/3),$2^M$) |
| VD | $2^M$ FOR ALL 3 ACS (ACS0, ACS1, AND ACS2) | 1 FOR ALL 3 ACS. |
| ACS_INITV | 0 FOR ACS0, N/9 FOR ACS1, 2N/9 FOR ACS2 | 0 FOR ACS0, 2N/9 FOR ACS1, N/9 FOR ACS2 |
| ACS UPDATE RATE | 1/3 | $1/(3*2^M)$ |
| SUBTRACT_V | N/3 | N/3 |
| B0 | RPT(010) | RPT(010) |
| B1 | RPT(001) | RPT(001) |
| B2 (B21 B20) | =B1 B0 (MOD3) | =B1 B0 (MOD3) |
| CONTINUED IN FIGURE 7E... | | |

Figure 7D

| CONTINUED FROM FIGURE 7D... | | |
|---|---|---|
| PARAMETERS | INTERLEAVER VALUES | DE-INTERLEAVER VALUES |
| N_ADDR_PTR | 1 | 1 |
| BURST/CDBK_IDX CALCULATION | FINAL_BIT_ADDR = ADS_OUTPUT*3+ MOD(I,3) FOR $ACS_K$ K=0,1,2 | FINAL_BIT_ADDR = ADSOUTPUT*3+ MOD(AI,3) FOR $ACS_K$ K=0,1,2 |
| NOTES | THE VI TABLES CAN EASILY BE REPLACED BY A GENERATOR MODULE AS SHOWN IN FIGURE 2. IN THIS CASE, BOTH VI AND VI_SEL ARE NOT USED. USE OF THREE ACS => ALTHOUGH ONLY 2 ACS ARE SHOWN IN FIGURE 2, ARBITRARY NUMBER OF ACS CAN BE ADDED FOR MORE GENERAL CASES. IN THE CASE OF 3 ACS, B2 MUST HAVE TWO SELECT LINES TO SELECT THE RIGHT ACS. | |

Figure 7E

UNIFIED INTERLEAVER/DE-INTERLEAVER

FIELD OF THE INVENTION

The present invention relates generally to wireless communication systems.

BACKGROUND

In wireless communication systems, block interleaving may be used to combat channel fading. Generally, interleaving re-orders bits of information to achieve time diversity of an original sequence of bits (i.e., interleaving changes the order of at least some bits in an original sequence with respect to time). When a transmitted interleaved signal is received, de-interleaving may be used to re-order the transmitted sequence back to the original sequence.

A variety of interleaving schemes exist in different wireless standards. Even in the same standard, there may still be a variety of coding schemes that use different interleaving algorithms. For example, the GSM/GPRS/EDGE standard has more than 15 different interleaving algorithms, including various look-up tables (LUTs). Interleaving algorithms may vary in block size (i.e., the amount of bits in an index), level of interleaving, use of bit pruning, and other considerations as will later be described.

Most interleaver/de-interleaver implementations may typically be tailored for use with a specified algorithm and may not easily be used with other algorithms. Being able to implement a plurality of different algorithms with one hardware and/or software solution is desirable. Furthermore, finding a multi-standard interleaving solution that does not require large amounts of memory and/or complex hardware is desirable.

SUMMARY

An interleaver/de-interleaver that may be used for multiple interleaving algorithms and look up tables (LUTs) of one or more interleaving standards. In at least some embodiments, the interleaver/de-interleaver may comprise an initial value selector, offset selector, and a pruning adjuster coupled to a combining block. The interleaver/de-interleaver may further comprise a boundary regulator coupled to the combining block, wherein the boundary regulator is configurable to modify an output of the combining block according to one or more pre-determined rules. The interleaver/de-interleaver may further comprise a controller coupled to, at least, the initial value selector, the offset value selector, and the pruning adjuster, whereby the interleaver/de-interleaver may interleave or de-interleave in accordance with a plurality of interleaving/de-interleaving techniques.

BRIEF DESCRIPTION OF THE DRAWINGS

For a detailed description of various embodiments of the invention, reference will now be made to the accompanying drawings in which:

FIG. 3 illustrates a table of parameters for implementing an interleaving/de-interleaving algorithm using the system of FIG. 2;

FIGS. 4A and 4B illustrate software code for implementing an interleaver/de-interleaver in accordance with embodiments of the invention;

FIGS. 5A-5S illustrate tables of parameters and parameter values that may be used to implement algorithms found in the GSM 05.03 V8.5.0 Release 1999 standard in accordance with embodiments of the invention;

FIGS. 6A-6B illustrate an interleaving algorithm (intra frame interleaving) according to a WCDMA standard found in 3GPP TS 25.212-v.3.5.0 (2000-12);

FIGS. 6C-6D illustrate tables of parameters and parameter values that may be used to implement the WCDMA standard of FIGS. 6A-6B in accordance with embodiments of the invention;

FIGS. 6E-6F illustrate a 30×30 look-up table (LUT) that may be used to implement the de-interleaver of the WCDMA standard of FIGS. 6A-6B in accordance with embodiments of the invention;

FIGS. 7A-7E illustrate tables of parameters and parameter values that may be used to implement algorithms of the IS2000 standard referenced in 3GPP2 C.S0002-C Version 1.0 in accordance with embodiments of the invention;

Figure 1:
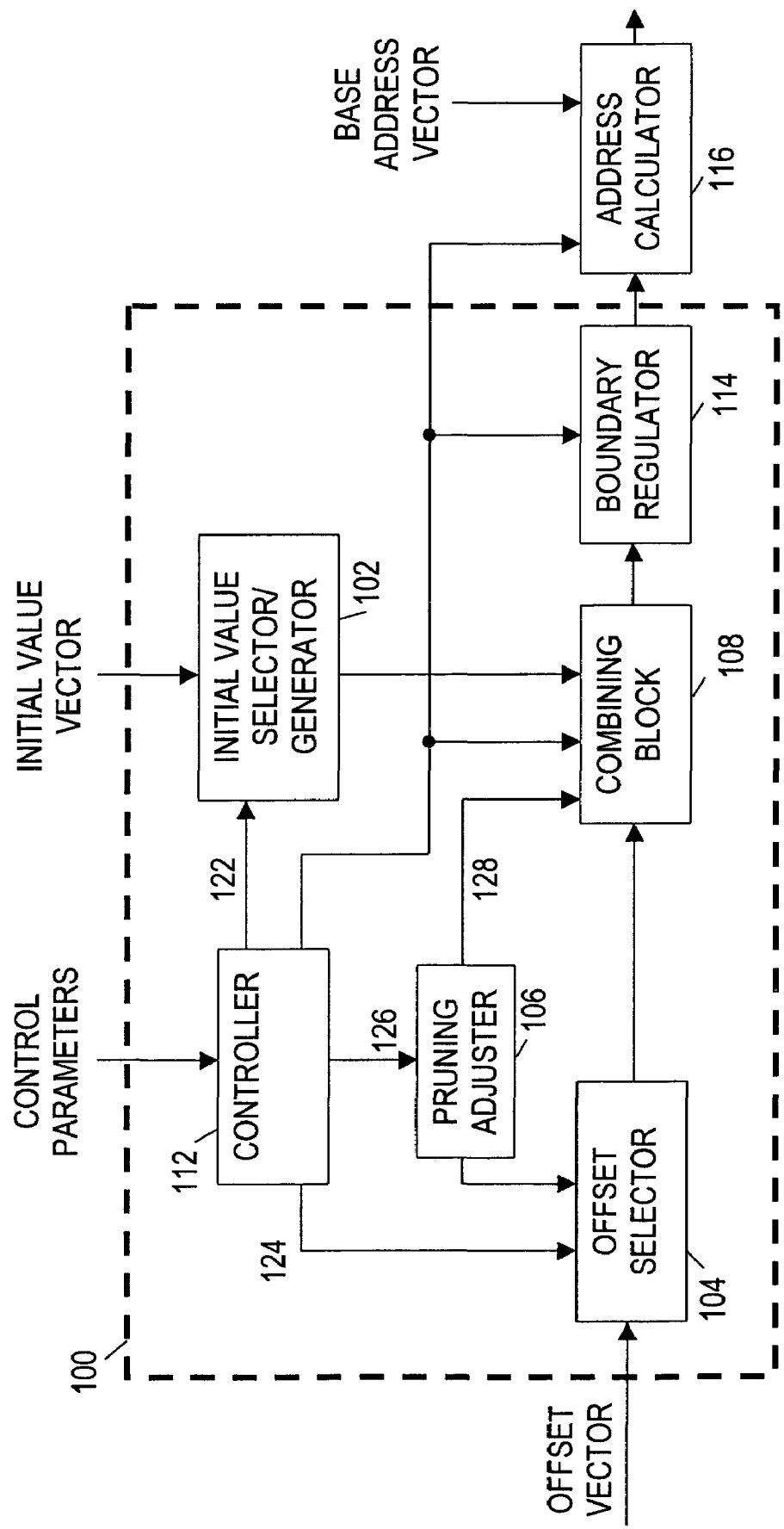
FIG. 1 illustrates a system for interleaving and/or de-interleaving in accordance with embodiments of the invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Notation and Nomenclature

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The subject matter disclosed herein generally relates to wireless communication systems. As previously mentioned, block interleaving may be used in wireless communications to combat channel fading. An interleaver (or de-interleaver) may be described as a look-up table ("LUT") or a set of equations where mods (i.e., modulus functions), multipliers, and dividers are used so that an arbitrary index can be mapped to its interleaved index.

As an example, consider wireless voice transmission (e.g., cell phones). At a first cell phone, the voice of a user may be processed as blocks of data. The blocks of data and/or bits within each block may be interleaved, such that bits of data that were ordered consecutively are now separated by other bits. The interleaved blocks of data may be transmitted by the first cell phone and received by a second cell phone. At the second (receiving) cell phone, the blocks of data may be de-interleaved (i.e., the original data sequence is restored) so that a user of the second cell phone may hear the voice characterized by the original blocks of data. The interleaving and de-interleaving process may reduce fading effects during wireless transmission of the voice data by spreading out interference. In addition to interleaving/de-interleaving, other measures (e.g., modulation, encoding) may be used to reduce channel fading.

In some embodiments, the function of interleavers and de-interleavers may be described as a non-linear differential equation:

$$\text{index}(i+1)=\text{index}(i)+f(i, \text{other\_parameters}), \quad i=0, 1, \ldots, N-1 \quad (1)$$

where N is the interleaver/de-interleaver block length, index( ) is the interleaved index, and f is a non-linear function that provides the distance (delta) for two consecutive input bits. For implementation convenience this equation may be rewritten as:

$$\text{index}(i+1)=\text{index}(0)+f(i, \text{other\_parameters}), \quad i=0, 1, \ldots, N-1 \quad (2)$$

where N is the interleaver/de-interleaver block length, index (0) is the first interleaved value of the original index, and f is a non-linear function that provides the distance (delta) for two consecutive input bits. The function f(i, other_parameters) may be decomposed into two parts: an offset part and an adjustment part. The offset part may calculate an offset relative to the initial value "index (0)", while the adjustment part may change the value of the calculated offset in case the calculated offset is not desired (e.g., in bit pruning cases).

Bit pruning removes unwanted bits of data from a data stream (e.g., a data stream associated with an interleaver algorithm) and compensates for spaces that are left in a data stream after unwanted bits have been removed. For example, a data block of arbitrary length may have a number of unrelated control bits that have been inserted between data bits of the data block. When de-interleaving, the control bits need to be taken out of the data block to prevent corruption of the data. As another example, in the WCDMA (Wideband Code Division Multiple Access) standard, an interleaving algorithm may write to a N×30 array, where N is the number of rows and 30 is the fixed number of columns. Because the data block length may be arbitrary, the last row of this array may not have exactly 30 elements. Therefore, there may be some blank bits in the last row. Consequently, when an interleaver reads the array column by column, those blank bits need be pruned in the interleaving algorithm.

As previously mentioned, the function f may be non-linear and may comprise modulus, multiplication, and division operations, or alternatively may comprise an LUT that provides the offset distances with respect to an index origin, e.g., index (0). In order to simplify implementation of an interleaver/de-interleaver, embodiments of the invention may constrain the input or output of the index to be linear (i.e., linearly increasing). For example, if an input to an interleaver is linear, the output may be a "randomly" indexed output sequence. Alternatively, if an output of an interleaver is linear, the input may be "random". This constraint satisfies operational environments in which a block of data is processed bit by bit as an input or an output.

By using linear input or output indices, embodiments of the invention may replace multiplier(s), modulus operator(s), and divider(s) commonly used for function f with accumulator(s), subtractor(s), and counters, respectively. In some embodiments, the elements of equation (2) may be vectorized, i.e, the initial index value "index (0)", the mapped index "index(i+1)", and the components of the f function are vectors wherein each element of the initial vectors may be viewed as the first value of each column in a matrix. Additionally, the offset part of f may be unified as a vectorized module operator "mod(kΔ,c)", where k is a linearly increasing auxiliary index, Δ is a difference vector, and c is a constant module value. In such embodiments, only accumulator(s) and subtractor(s) may be needed to implement the mod(kΔ,c) operation because of the linearity of k.

FIG. 1 illustrates a block diagram of an interleaving/de-interleaving system 100 in accordance with embodiments of the invention. As shown in FIG. 1, the system 100 may comprise an initial value selector/generator 102, an offset selector 104, a pruning adjuster 106, a combining block 108, a controller 112, and a boundary regulator 114.

As shown in FIG. 1, the initial value selector/generator 102 may couple to the controller 112 and the combining block 108. The offset selector 104 may couple to the controller 112, the pruning adjuster 106, and the combining block 108. The pruning adjuster 106 may couple to the controller 112, the offset selector 104, and the combining block 108. The combining block 108 may couple to the initial value selector/generator 102, the offset selector 104, the pruning adjuster 106, the controller 112, and the boundary regulator 114. The boundary regulator 114 may couple to the combining block 108, the controller 112, and an address calculator 116. The address calculator 116 may also couple to the controller 112.

As illustrated in FIG. 1, the initial value selector/generator 102 may receive as input an initial vector having one or more values. Additionally, the initial vector may comprise a plurality of vectors. In at least some embodiments, the initial vector may comprise one or more predetermined vectors that may correspond to a particular algorithm and/or whether the system 100 is used for interleaving or de-interleaving. Additionally, or alternatively, the initial vector may be programmable. In operation, the initial value selector/generator 102 may select an initial vector value and output that value to the combining block 108. In at least some embodiments, a control signal 122 from the controller 112 may determine which initial vector value is selected and output to the combining block 108. Additionally or alternatively, the initial value selector/generator 102 may generate initial values. Therefore, in at least some embodiments an initial value vectors may not be used.

The offset selector 104 may receive as input an offset vector having one or more values. In at least some embodiments, the offset vector may comprise a predetermined vector that corresponds to a particular interleaving algorithm and/or whether the system 100 is used for interleaving or de-interleaving. Additionally, or alternatively, the offset vector may be programmable. In operation, the offset selector 104 may select an offset vector value and output that value to the combining block 108. In at least some embodiments, a control signal 124 from the controller 112 may determine which offset vector value is selected and output from the offset selector 104 to the combining block 108. Additionally, the offset selector 104 may receive an input from the pruning adjuster 106, whereby an adjusted offset value is output to the combining block 108.

The pruning adjuster 106 may change (i.e., adjust) the value of the offset value received by the offset selector 104. In at least some embodiments, the pruning adjuster 106 function according to a control signal 126 from the controller 112. For example, the pruning adjuster 106 may adjust the offset value by adding or subtracting an amount determined by the control signal 126. Additionally, or alternatively, the pruning adjuster 106 may change add or subtract a value from the combining block 108 operation according to the control signal 128 as will later be explained.

For example, there may be interleaving/de-interleaving algorithms in which using a fixed offset value is undesirable (such as when bit pruning is used). Accordingly, in at least some embodiments, the pruning adjuster 106 in coordination with the controller 112 may implement a bit pruning mechanism as previously described. Additionally, or alternatively, the pruning adjuster 106 may be used to account for interleaving algorithms that implement "burst mapping" (e.g., at least some algorithms in the GSM standard implement burst mapping). Burst mapping may comprise another level of interleaving (e.g., block diagonal interleaving in the GSM standard). In some embodiments, each burst may comprise a number of interleaved data blocks with bits from different data blocks ordered consecutively.

The combining block 108 receives an output value from the initial value selector/generator 102, the offset selector 104, and the pruning adjuster 106. By combining these outputs, the combining block 108 creates an "offset index position" that may be used to interleave or de-interleave a single bit of an index of bits. As the name infers, the offset index position may be an index position that is offset (i.e., separated) from some original or "base" index position. The base index position may be a predetermined starting address of a block of data (e.g., "index 0" as described previously). In some embodiments, the base index position may be a previous offset index position.

The offset index position may be received by a boundary regulator 114, which functions to output an index position within the boundaries of a predetermined index. In some embodiments, the boundary regulator may determine if the offset index position is within the index boundary of a predetermined index. If the offset index position is within the index boundary, that offset index position may be output from system 100 for use with interleaving or de-interleaving a block of data. If the offset index position is not within the index boundary, an adjustment may be made so that the offset index position is modified to be within the index boundary. In some embodiments, one or more pre-determined rules may be used to modify an offset index position when necessary. For example, a predetermined index number (i.e., amount) may be subtracted from the offset index position so that the offset index position is moved to within the boundaries of the index (i.e., a modulus operation may be performed). In at least some embodiments, the amount subtracted from the offset index position may be equal to the data block size. More specifically, if an index [0:455] is to be interleaved, then an amount of 456 may be subtracted from an offset index position that is not within the [0:455] boundary. Assuming that the resultant index position is generated by an addition of an initial index value and a positive offset, the offset index position may possibly exceed the upper boundary of an index. A more detailed example will later be described. The output of the boundary regulator 114 may be used by an address calculator 116 to interleave or de-interleave a block of data. The address calculator 116 may also be a vector of multiple addresses wherein different indexes may be combined with different base addresses.

Figure 2:
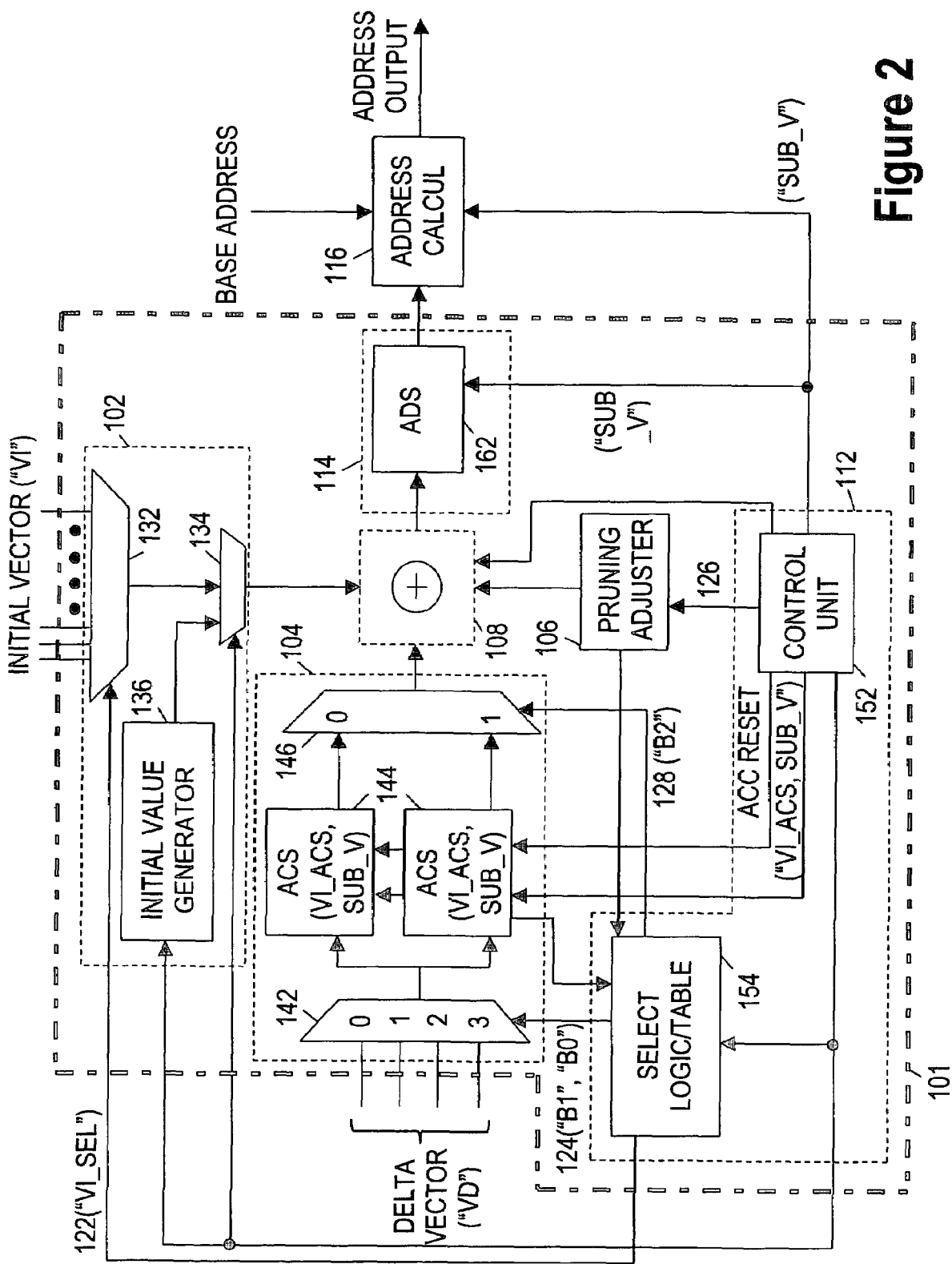
FIG. 2 illustrates another system for interleaving and/or de-interleaving in accordance with embodiments of the invention.

FIG. 2 illustrates another embodiment of an interleaving/de-interleaving system 101 in accordance with embodiments of the invention. As shown in FIG. 2, the system 101 may comprise an initial value selector/generator 102, an offset selector 104, an pruning adjuster 106, a combining block 108, a controller 112, and a boundary regulator 114. The initial value selector/generator 102 may couple to the controller 112 and the combining block 108. The offset selector 104 may couple to the controller 112, the pruning adjuster 106, and the combining block 108. The pruning adjuster 106 may couple to the controller 112, the offset selector 104, and the combining block 108. The combining block 108 may couple to the initial value selector/generator 102, the offset selector 104, the pruning adjuster 106, the controller 112, and the boundary regulator 114. The boundary regulator 114 may couple to the combining block 108, the controller 112, and an address calculator 116. The address calculator 116 may also couple to the controller 112.

As shown in FIG. 2, the initial value selector/generator 102 may comprise a multiplexer 134 that couples to another multiplexer 132 and an initial value generator 136. The offset selector may comprise a multiplexer 142 that couples to one or more accumulator/subtracters (ACSs) 144. The outputs of the ACSs 144 may couple to another multiplexer 146. The controller 112 may comprise a control unit 152 coupled to a select logic/table 154. The combining block 108 may comprise a summer. The boundary regulator 114 may comprise an adder/subtracter (ADS) 162.

In operation, the initial value selector/generator 102 may select an initial value from an initial vector ("VI") according to a control signal ("VI_SEL") 122 from controller 112. Alternatively, the initial value generator 136 of the initial value selector/generator 102 may generate an initial value as directed by the controller 112. The multiplexer 134 may select to output either a generated value from the generator 136 or a selected value from the multiplexer 132 in accordance with a control signal from the controller 112. The output of the initial value selector/generator 102 is input to the combining block 108.

As previously mentioned, the offset selector 104 may comprise multiplexers 142, 146 and one or more ACSs 144. The multiplexer 142 may select a value from a delta vector ("VD") according to a control signal 124 ("B1", "B0") from the controller 112. The selected delta vector ("VD") value may be input to the one or more ACSs 144, which may add or subtract an amount to the delta value. For example, the controller 112 may provide an initial value ("VI_ACS") and a subtract value ("SUB_V" or "SUBTRACT_V") to the ACSs 144. The VI_ACS value may provide a base value to which the VD value described above may be combined with (i.e., added to). The SUB_V value may be subtracted from the combination of VD and VI_ACS. In at least some embodiments, the ACSs 144 may function according to the Algorithm 1 shown below.

Algorithm 1 accumulator$_{base}$=VI_ACS;
For each clock cycle,
If accumulator$_{ACS}$>=SUBTRACT_V
    output$_{ACS}$=accumulator$_{ACS}$−SUBTRACT_V;
Else
    output$_{ACS}$=accumulator$_{ACS}$;
End if
accumulator$_{base}$=accumulator$_{ACS}$+VD$_{selected}$.

As shown in Algorithm 1, the ACSs 144 may implement an initial base value ("accumulator$_{base}$") equal to a parameter value ("VI_ACS"). For example, if VI_ACS equals two, the first accumulator value ("accumulator$_{ACS}$") will equal two rather than zero. For each clock cycle, each ACS 144 may calculate a new accumulator$_{ACS}$ value. As shown in Algorithm 1, if the current accumulator$_{ACS}$ value is greater than or equal to a parameter value ("SUBTRACT_V") the output ("output$_{ACS}$") of an ACS 144 may be equal to accumulator$_{ACS}$–SUBTRACT_V. Otherwise, the output$_{ACS}$ value may equal the accumulator$_{ACS}$ value. If the accumulator$_{base}$ value is equal to the combination of the accumulator$_{ACS}$ value and the VD$_{selected}$ value, the ACSs 144 have completed a cycle of interleaving (i.e., the output$_{ACS}$ values will begin to repeat) for a particular interleaving algorithm. The multiplexer 146 may receive the outputs of the ACSs 144 and select/output a value according to a control signal from the controller 112. The output of the offset selector 104 may be combined with the output initial vector value by the combining block 108.

The pruning adjuster 106 may function with the controller 112 to control bit pruning and burst mapping as previously described. Accordingly, the pruning adjuster 106 may output a signal to the combining block 108, whereby the output of the combining block 108 (the offset index value previously described) may be adjusted. As shown in FIG. 2, the pruning adjuster 106 may function in accordance with a control signal 126 from the control unit 152 of the controller 112. In at least some embodiments, the pruning adjuster 106 may function to add, update and/or adjust values stored in the select logic/table 154 of the controller. In some embodiments, the system 101 may automatically account for bit pruning values based on a set of parameters. Therefore, no time (e.g., clock cycles) is wasted to discard unwanted bit index values.

As previously described, the output of the combining block 108 may be called an offset index value. The offset index value may be input to the boundary regulator 114, which may ensure the index value is within the index boundary as previously described. In operation, the ADS 162 of the boundary regulator 114 may receive the offset index value from the combining block 108 and a control signal from the control unit 152 of the controller 112. For example, the control signal may indicate whether the ADS 162 should add or subtract one or more pre-determined values. In at least some embodiments, the ADS 162 may function according to the Algorithm 2 shown below.

Algorithm 2 sum$_{ADS}$=VI$_{selected}$+offset$_{selected}$+prune_value$_{selected}$;
If sum$_{ADS}$>=SUBTRACT_V
    output$_{ADS}$=sum$_{ADS}$–SUBTRACT_V;
Else
    output$_{ADS}$=sum$_{ADS}$.

As shown in algorithm 2, the ADS 162 may calculate a sum value ("sum$_{ADS}$") by summing a selected initial value ("VI$_{selected}$") with a selected offset value ("offset$_{selected}$") and a selected prune value ("prune_value$_{selected}$"). If sum$_{ADS}$ is greater than or equal to a parameter value "SUBTRACT_V" (also called "SUB_V"), then the output ("output$_{ADS}$") of the ADS 162 may equal sum$_{ADS}$–SUBTRACT_V. Otherwise, output$_{ADS}$ may equal sum$_{ADS}$. The output of the ADS 162 may be used as an output value of the interleaver/de-interleaver 101.

The output of the interleaver/de-interleaver 101 may be input to an address calculator 116 as previously described. As shown in FIG. 2, the address calculator 116 may combine a base address and the interleaver/de-interleaver output value (also called an offset index value) to output an interleaved or de-interleaved index of addresses. In some embodiments, the controller 112 may function in conjunction with the address calculator 116 to interleave/de-interleave a block a data to and/or from multiple blocks of base addresses.

In at least some embodiments, the systems 100, 101 may allocate bits of data to a burst such that one burst is completed before the next burst is created. When a burst has been completed, that burst may be transmitted. In contrast, other interleaver/de-interleavers follow a pattern in which all of the bursts receive a single bit of data before any of the bursts receive the second bit of data. The process of allocating one bit to each burst is typically repeated until all of the bursts are filled to capacity. Therefore, some embodiments of the invention may require less memory to buffer data bursts prior to transmission than others interleavers and/or de-interleavers that buffer all (or nearly all) data to bursts before transmitting.

As an example, consider a data block having 64 bits of data to interleave/de-interleave. More specifically, an interleaver may interleave the 64 bits according to the following pattern of bit index positions: [0, 30, 60, 20, 50, 10, 40, 5], [35, 15, 45, 25, 55, 3, 33, 63], [13, 43, 23, 53, 8, 38, 18, 48], [28, 58, 1, 31, 61, 11, 41, 21], [51, 6, 36, 16, 46, 26, 56, 4], [34, 14, 44, 24, 54, 19, 49, 9], [39, 29, 59, 12, 42, 2, 32, 63], [7, 37, 22, 52, 27, 57, 17, 47]. In some embodiments, the algorithm may separate the data into 8 bursts of data comprising 8 bits each such that the bursts of data are formed together a bit at a time (i.e. burst 0 receives a bit, burst 1 receives a bit, burst 2 receives a bit, etc.) until all of the bursts are filled.

As shown, burst 0 may comprise bits 0, 30, 60, 20, 50, 10, 40, and 5. Burst 1 may comprise bits 35, 15, 45, 25, 55, 3, 33, and 63. Burst 2 may comprise bits 13, 43, 23, 53, 8, 38, 18, and 48. Burst 3 may comprise bits 28, 58, 1, 31, 61, 11, 41, and 21. Burst 4 may comprise bits 51, 6, 36, 16, 46, 26, 56, and 4. Burst 5 may comprise bits 34, 14, 44, 24, 54, 19, 49, and 9. Burst 6 may comprise bits 39, 29, 59, 12, 42, 2, 32, and 63. Burst 7 may comprise bits 7, 37, 22, 52, 27, 57, 17, and 47.

As previously explained, instead of filling the bursts together one bit at a time as described by the interleaving algorithm, some embodiments of the invention may complete and transmit burst 0, then complete and transmit burst 1, etc., until all of the bursts have been completed and transmitted. Accordingly, less memory is required to buffer (temporarily store) 8 bits of data assigned to one burst as opposed to buffering approximately 64 bits of data as would be required if the data is distributed to burst 0 through burst 7 in an alternating bit to burst allocation scheme (i.e. burst 0 receives a bit, burst 1 receives a bit, burst 2 receives a bit, etc.)

FIG. 3 illustrates a table of parameters that may be used to implement the interleaver/de-interleaver 101 of FIG. 2. Specifically, FIG. 3 illustrates a set of general parameters that may be used to implement a variety of interleaving/de-interleaving algorithms (i.e. techniques) using the interleaver/de-interleaver 101. As shown, the parameters may comprise an initial vector ("VI"), an initial vector selection control ("VI_sel"), a delta (offset) vector ("VD"), an ACS initial value ("ACS_VI"), an ACS update rate, an adjust value ("Subtract_V"), a select line ("B0") for a VD multiplexer, another select line ("B1") for the VD multiplexer, a select line ("B2") for multiplexer 108, a number of address pointers value ("N_addr_ptr"), and a burst/code of blocks index calculation ("bst/cdbk index calculation"). Additionally, the table of FIG. 3 also includes a "notes" section that is used to describe aspects of the interleaving/de-interleaving process.

The VI parameter may be input to initial value selector 102. As previously described the initial vector may be a vector of variable length. Additionally, VI may comprise a plurality of vectors. As shown in FIG. 3, the VI for interleaving may comprise (0, 98, 82, 66) while the VI for de-interleaving may comprise four vectors: (0, 228), (57, 285), (114, 342), (171, 399). In at least some embodiments, only one vector is used at a time. For example, the vector (0, 228) may be used to assemble a burst "0" from one or more different code blocks ("CDBKs"). Specifically, the vector (0, 228) may be used to assemble burst "0" for CDBKs "0" and "−1." Based on the VI parameter, the system 101 may output a number of addresses based on code block pointers ("CDBK_ptr") plus an offset value. For example, if the vector (0, 228) is used as the VI parameter for burst "0," the system 101 may output the address locations for burst "0" as: CDBK0_ptr+0, CDBK1_ptr+228, CDBK0_ptr+64, CDBK1_ptr+292, CDBK0_ptr+128, etc. In the address locations described above, an offset of 64 is added to the start locations "0" and "228" for the CDBL0 and CDBK1 addresses respectively. This process of adding 64 to an address in continued (for this particular algorithm) until the first burst is assembled. Once the first burst is assembled, the second VI vector (57, 285) may be used for the next burst and so on. This process is repeated. For this particular algorithm, eight bursts are assembled (after four bursts the CDBKs used are CDBK 1 and CDBK 0).

The VI_SEL parameter may be input to the initial value selector 102 as a control signal (e.g. signal 122) that permits the initial value selector 102 to select one of the VI values. As shown in FIG. 3, VI_SEL may comprise a signal "K[B1B0]" (interleaving) or "J[B0]" (de-interleaving) that correspond to bit 1 "B1" and/or bit 0 "B0" values taken from a linear index counter J or K. As previously described, either K or J may be a linear index which may then be interleaved/de-interleaved. For example, in at least some embodiments K[B1B0] may follow a repeated two-bit pattern 00, 01, 10, 11 (i.e. a repeated 0, 1, 2, 3 pattern) for interleaving and J[B0] may follow a repeated one-bit pattern 0, 1 for de-interleaving. The signals K[B1B0] and/or J[B0] may correspond to control signal 122 shown in FIGS. 1 and 2.

The VD parameter may be input to the offset selector 104. As previously described VD may be a vector of variable length. The ACS_VI parameter may be input to the ACSs 144 shown in FIG. 2. The ACS_VI provides the ACSs 144 with an initial value. As shown in FIG. 3, the ACS_VI may comprise "0" for both interleaving and de-interleaving.

The ACS update rate may control the ACSs 144 shown in FIG. 2. In some embodiments, the ACS update rate controls how often an accumulator of each ACS 144 updates the VD value (described above). As shown in FIG. 3, the ACS update rate may be "¼" (i.e., the ACSs 144 are updated every four cycles) for interleaving and "½" (i.e., every two cycles) for de-interleaving. More specifically, if system 100 is used for de-interleaving, the ACSs 144 of offset selector 104 may start with an ACS initial value (ACS_VI) of "0" as previously described. If VD=64, and the ACS update rate=½ as previously described, the pattern followed by the output of the ACSs 144 would be 0, 0, 64, 64, 128, 128, etc. The value stored by each ACS 144 may be added to or subtracted from the selected offset value.

Eventually the offset value used by the ACSs 144 may force the index value to go beyond a desired index boundary. Accordingly, the adjust value ("SUB_V") may be used to compensate for such situations. The SUB_V parameter may be input to the ACSs 144 and the boundary regulator 114 shown in FIG. 2 to adjust the index value such that the index value is moved to within a desired boundary. As shown FIG. 3, SUB_V may equal "114" for interleaving and "456" for de-interleaving. For example, if the index boundaries are [0:455] as illustrated in algorithm 301 (shown in FIG. 3), and the system 101 is used for de-interleaving then the amount of 456 may be subtracted from an index value whenever that index value is greater than 455.

"B0" (e.g. a multiplexer select line control) may be input to offset selector 104 as a control line. Accordingly, the offset selector 104 may select a VD value according to B0. As shown in FIG. 3, B0 may equal a K[B2] value, where K[B2] is the second bit taken from a linear index K. Specifically, B0 may comprise a repeated 00001111 pattern for interleaving and constant "0" for de-interleaving. "B1" (e.g. a multiplexer select line control) also may be input to offset selector 104 as a control line. As shown in FIG. 3, B1 may equal "0" for both interleaving and de-interleaving. B0 and B1 may used to select the "VD" parameters illustrated of FIG. 2.

The parameter B2 (e.g. a multiplexer select line control) may be input to multiplexing logic 108 as a control line. Therefore, the multplexing logic 108 may select which ACS value to forward to computation block 110 according to B2. In some embodiments, B2 may equal "0" for both interleaving and de-interleaving. In such embodiments, only one of the ACS block is used. However in other embodiments interleaving algorithms may be more complicated and thus require more sophisticated control of multiplexing logic 108. Additionally, some embodiments may utilize additional (more than two) ACSs 144. In at least some embodiments, the B2 value may comprise multiple bits for each clock cycle. For example, FIG. 7D illustrates an embodiment in which B2 comprises two bits.

The number of address pointers ("NUM_ADDR_PTR") parameter may be used by system 100 when implementing bursts as previously described. As shown in FIG. 3, NUM_ADDR_PTR may equal eight for de-interleaving (i.e. one block of code is assembled from 8 bursts). Additionally, NUM_ADDR_PTR may equal two for interleaving (i.e. one burst is assembled from two blocks of code). NUM_ADDR_PTR may be input to controller 112, offset adjuster 106, and/or address calculator 116 in order to assemble bursts and blocks of code.

BST/CDBK index calculation may be performed in the controller 112 and output to the address calculator 116 such that the index locations of bursts and blocks of code may be determined. As shown in FIG. 3, the BST/CDBK index calculation may be equal to K[B2B1B0] (i.e. MOD(K,8)) for an interleaver and N−MOD(J,2)+FLOOR(BST_IDX/4) for a de-interleaver. In the function "N−MOD(J,2)+FLOOR (BST_IDX/4)", BST_IDX corresponds to burst indices 0, 1, 2, 3, 4, 5, 6, and 7, N corresponds to the index of a block of code, MOD corresponds to a modulus function where "MOD (J, 2)"=J−2*FLOOR(J/2), and FLOOR corresponds to rounding to the next lowest integer.

The parameters illustrated in FIG. 3 may be used for many different interleaving/de-interleaving algorithms as will later be described. By using the parameter values shown in the table of FIG. 3, the system 101 may interleaving or de-interleaving (reverse interleaving) according to the algorithm 301. The algorithm 301 may be found in section 3.1.3 of the GSM 05.03 V8.5.0 release 1999 standard. By changing and/or programming the parameter values, the system 101 may function as an interleaver/de-interleaver for many different algorithms. These algorithms may be found in standards such as GSM/GPRS/EDGE, WCDMA, and IS2000.

FIGS. 4A-4B illustrate a software implementation of an interleaving/de-interleaving algorithm. As shown in FIG. 4A, the algorithm 401 found in section 3.1.3 of the GSM 05.03 V8.5.0 release 1999 standard may be implemented. The FIG. 4A illustrates an embodiment of "hardware code" 403 which illustrates the functionality of the interleaver/de-interleaver 101. FIG. 4B illustrates hardware code related to several interleaving/de-interleaving patterns illustrated in columns 0-7 of Table 1 of the GSM 3.1.3 standard.

FIGS. 5A-5S illustrate tables of parameters and parameter values that may be used to implement interleaving and/or de-interleaving algorithms found in the GSM 05.03 V8.5.0 release 1999 standard using the interleaver/de-interleaver 101 of FIG. 2. Specifically, the parameters and parameter values permit system 101 to execute interleaving and/or de-interleaving as described by various tables and algorithms found in the GSM 05.03 V8.5.0 release 1999 standard. In particular, the system 101 may implement MCS-5 EDGE interleaving/de-interleaving algorithms (e.g., as shown in FIGS. 5K and 5L) without using the large look-up table provided by the GSM standard. Specifically, the GSM standard provided the look-up tables for certain algorithms due to a lack of a closed-form description for the interleaving algorithm. Accordingly, embodiments of the invention may implement closed-form versions of these GSM algorithms using the hardware and parameters described previously for FIGS. 1 and 2. While embodiments of the invention may be used to implement interleaving algorithms found, for example, in industry standards such as the GSM 05.03 V8.5.0 release 1999 standard, the invention is not limited to any particular standard.

FIGS. 6A and 6B illustrate an interleaving algorithm according to a WCDMA (Wideband Code Division Multiple Access) standard found in the 3GPP TS 25.212-v.3.5.0 (2000-12) release 1999 standard. FIGS. 6C-6D illustrate a table of parameters and parameter values that may be used with the system 101 to implement the algorithm illustrated in FIGS. 6A and 6B. FIGS. 6E and 6F illustrate a 30×30 look up table (LUT) that may be used by the system 101 to provide a de-pruning adjustment when implementing the WCDMA standard illustrated in FIGS. 6A and 6B. Specifically, the LUT contains adjustment values that may be used by the boundary regulator 114 to adjust the combined initial value and offset value such that the extraneous (dummy) bits (referred to in FIG. 6B) are automatically "pruned" without using extra logic and/or waiting cycles.

FIGS. 7A-7E illustrate tables of parameters and parameter values that may be used to implement a number of interleaving and/or de-interleaving algorithms found in the IS2000 standard, referenced in 3GPP2 C.S0002-C VERSION 1.0.

Figure 8:
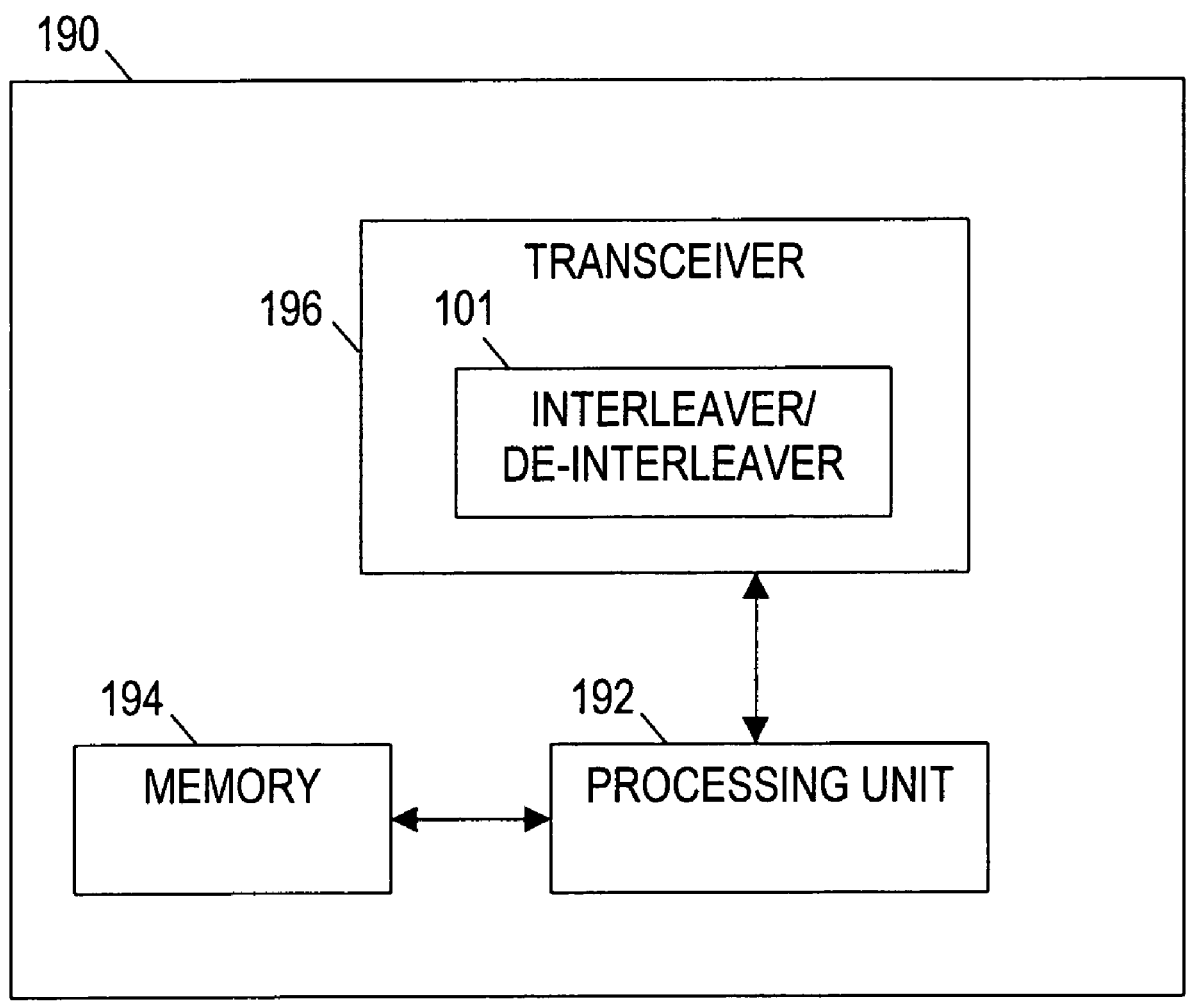
FIG. 8 illustrates a system that implements an interleaver/de-interleaver in accordance with embodiments of the invention.

FIG. 8 illustrates an embodiment of an apparatus 190 that may implement the interleaving/de-interleaving systems 100 and/or 101 shown in FIGS. 1 and 2. As shown in FIG. 8, the apparatus 190 may comprise processing unit 192 coupled to a memory 194 and a transceiver 196, wherein the transceiver implement the interleaver/de-interleaver 101. The apparatus 190 may be representative of a cell phone, personal digital assistance, laptop computer, or any other device that may use interleaving/de-interleaving when communicating. Additionally, embodiments of the invention may be implemented with any transmitter and/or receiver of a communication system.

Figure 9:
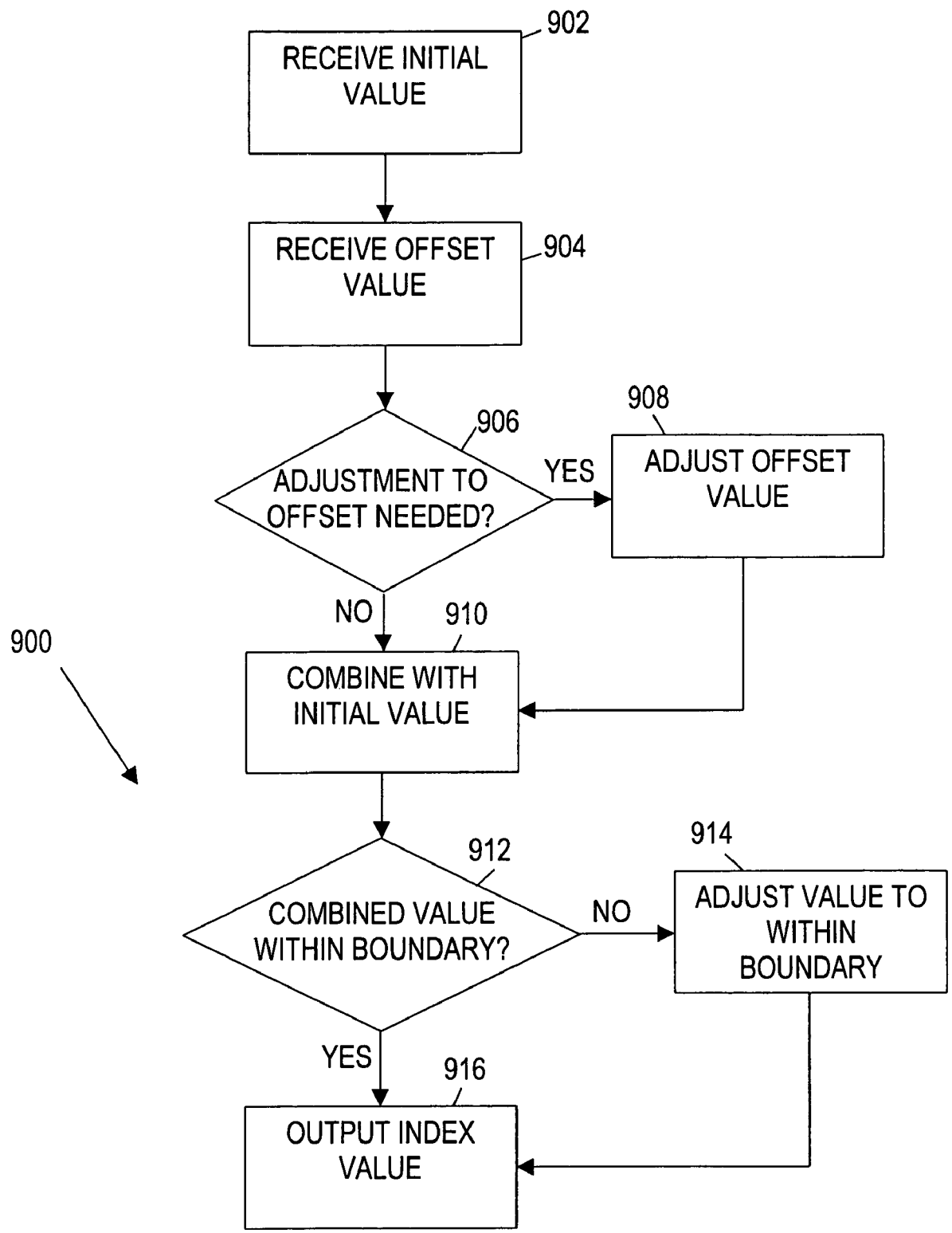
FIG. 9 illustrates a method for interleaving/de-interleaving data in accordance with embodiments of the invention.

FIG. 9 illustrates a method 900 for interleaving/de-interleaving a block of data in accordance with embodiments of the invention. As shown in FIG. 9, the method 900 may comprise receiving an initial value (block 902) and receiving an offset value (block 904). As previously explained, the initial value and offset values may be selected from one or more vectors. Alternatively, the initial value and/or offset value may be generated as previously described. If the offset needs to be adjusted as determined at block 906, the offset may be adjusted accordingly (block 908), then combined with the initial value (block 910). As described above, the offset may be adjusted to account for bursts and/or bit pruning. If the offset does not need to be adjusted as determined at block 906, the unadjusted offset value is combined with the initial value (block 910).

At block 912, a determination is made as to whether the combined initial value and offset is within a pre-determined boundary (e.g. an index boundary). If the combined value is not within the pre-determined boundary as determined at block 912, the combined value may be adjusted so that it is moved to within the pre-determined boundary (block 914). The adjusted combined value may then be output as an index value (block 916). If the combined value is determined to be within the pre-determined boundary (block 912), the combined value may be output as an index value (block 916). As described above, the output index value may be used by an address calculator or other hardware or software functions to interleave and/or de-interleave a block of data.

While the preferred embodiments of the present invention have been shown and described, modifications thereof can be made by one skilled in the art without departing from the spirit and teachings of the invention. For example, some embodiments may implement other existing interleaving algorithms that were not mentioned, or future interleaving standards. The embodiments described herein are exemplary only, and are not intended to be limiting. Many variations and modifications of the invention disclosed herein are possible and are within the scope of the invention. Accordingly, the scope of protection is not limited by the description set out above. Each and every claim is incorporated into the specification as an embodiment of the present invention.

What is claimed is:

1. An interleaver/de-interleaver, comprising:
   an initial value selector configurable to select an initial value from a programmable set of initial values;
   an offset selector coupled to the initial value selector, the offset selector is configurable to select an offset value from a set of programmable offset values;
   a pruning adjuster coupled to the offset selector, the adjuster is configurable to modify the offset value;
   a boundary regulator coupled to the initial value selector, the offset selector, and the pruning adjuster, the boundary regulator is configurable to ensure a combination of the initial value with a selected offset value or a modified offset value are within a pre-determined index boundary; and
   a controller coupled to the initial value selector, the offset selector, and the pruning adjuster, the controller asserts control signals provided to the initial value selector, the offset selector, and the pruning adjuster, such that a plurality of interleaving/de-interleaving algorithms are executable.

2. The interleaver/de-interleaver of claim 1 wherein the initial value selector and the offset selector comprise multiplexers.

3. The interleaver/de-interleaver of claim 2 wherein the offset selector further comprises one or more accumulator/subtractors.

4. The interleaver/de-interleaver of claim 1 wherein the controller accesses a programmable table having adjustment values used by the boundary regulator.

5. The interleaver/de-interleaver of claim 1 wherein the pruning adjuster is configurable to adjust the value of the combination of the initial value with the selected offset value or the modified offset value.

6. The interleaver/de-interleaver of claim 1 further comprising a combining block coupled to the initial value selector, the offset selector, the pruning adjuster, and the boundary regulator, wherein the combining block is configurable to combine the initial value with the selected offset value or the modified offset value.

7. The interleaver/de-interleaver of claim 1 further comprising a parameter received by at least one selected from the group consisting of the initial value selector, the offset selector, the pruning adjuster, the boundary regulator, and the controller.

8. The interleaver/de-interleaver of claim 7 wherein the parameter is selected from the group consisting of:
an initial vector input to the initial value selector;
an initial vector selection control input to the initial value selector;
an offset vector input to the offset selector;
an accumulator/subtractor initial value input to the offset selector;
an accumulator/subtractor update rate input to the offset selector;
an adjustment value input to the boundary regulator;
a subtract value input to the boundary regulator and the offset selector;
a multiplexer select line control input to the initial value selector;
a multiplexer select line control input to the offset selector;
a number of address pointers value;
a burst index calculation; and
a code of blocks index calculation.

9. The interleaver/de-interleaver of claim 1 wherein the boundary regulator comprises an addition/subtraction block.

10. A method for interleaving/de-interleaving, comprising:
receiving a vector having multiple initial values, wherein the vector varies for different interleaving/de-interleaving techniques;
selecting one of the initial values based on a repeating pattern that varies for different interleaving/de-interleaving techniqes;
receiving a configurable offset value that varies for different interleaving/de-interleaving techniques;
iteratively combining the offset value with each selected initial value;
iteratively outputting an index value using the combination of the offset value with each selected initial value; and
receiving changeable parameter values for a set of fixed parameters such that an interleaver/de-interleaver outputs an index according to a plurality of interleaving/de-interleaving techniques.

11. The method of claim 10 further comprising adjusting the offset value according to one of the parameter values.

12. The method of claim 10 further comprising adjusting the combination of the offset with the initial value according to one of the parameter values.

13. The method of claim 12 wherein adjusting the combination of the offset with the initial value comprises accessing a look-up table that contains adjustment values.

14. The method of claim 10 further comprising finishing a burst of data before starting another burst of data.

15. The method of claim 10 further comprising inputting a linearly increasing index as a sequence of initial values.

16. The method of claim 10 further comprising outputting a linearly increasing index.

17. A storage medium containing processor-readable instructions that are executable by a processor and cause the processor to:
receive parameter values of a set of parameters, the set of parameters are used to implement a plurality of interleaving/de-interleaving techniques;
select an initial value according to one of the parameters, the initial value is selected from a vector that varies for different interleaving/de-interleaving techniques compatible with the set of parameters;
select an offset value according to one of the parameters;
combine the initial value with an offset; and
output an index value associated with the combination of the initial value and the offset.

18. The storage medium of claim 17 wherein the processor-readable instructions further cause the processor to adjust the selected offset value according to one of the parameters.

19. The storage medium of claim 17 wherein the processor-readable instructions further cause the processor to adjust the combination of the initial value with the offset according to one of the parameters.

20. A system, comprising:
means for inputting values of parameters that describe a plurality of interleaving/de-interleaving techniques;
means for selecting an initial value from one of the parameters, the initial value is selected from a vector that varies for different interleaving/de-interleaving techniques compatible with the set of parameters;
means for selecting an offset value from one of the parameters;
means for combining the initial value with an offset; and
means for outputting an index value associated with a combination of the initial value with the offset as an index location for a bit of data.

21. The system of claim 20 further comprising means for modifying the offset value according to one of the parameters.

22. The system of claim 20 further comprising means for modifying the combination of the initial value with the offset according to one of the parameters.

23. An apparatus, comprising:
a processor;
a memory coupled to the processor; and
a transceiver coupled to the processor, wherein the transceiver includes an interleaver/de-interleaver configurable for use with a plurality of interleaving or de-interleaving techniques according to an updatable set of parameter values,
wherein the interleavable/de-interleaving followes an initial value selection pattern that varies for different interleaving/de-interleaving techniques compatible with the parameter values.

24. The apparatus of claim 23 wherein the interleaver/de-interleaver comprises an initial value selector that selects an initial value for use with an interleaving or de-interleaving technique.

25. The apparatus of claim 23 wherein the interleaver/de-interleaver comprises an initial value generator that generates an initial value for use with an interleaving or de-interleaving technique.

26. The apparatus of claim 23 wherein the interleaver/de-interleaver comprises an offset value selector that selects an offset value for use with an interleaving or de-interleaving technique.

27. The apparatus of claim 23 wherein the interleaver/de-interleaver comprises a offset adjuster for adjusting an offset value for use with an interleaving or de-interleaving technique.

28. The apparatus of claim 27 wherein the offset adjuster is configurable to automatically adjust the offset value for an interleaving or de-interleaving technique in accordance with bit pruning techniques of at least one interleaving or de-interleaving technique.

* * * * *